(12) United States Patent
Whiteside et al.

(10) Patent No.: US 7,173,744 B1
(45) Date of Patent: Feb. 6, 2007

(54) ARTICLE COMPRISING HOLOGRAPHIC MEDIUM BETWEEN SUBSTRATES HAVING ENVIRONMENTAL BARRIER SEAL AND PROCESS FOR PREPARING SAME

(75) Inventors: Peter A. Whiteside, Longmont, CO (US); Michael C. Cole, Longmont, CO (US); Vladimir Krneta, Longmont, CO (US); David R. Schoenfeld, Thornton, CO (US)

(73) Assignee: InPhase Technologies, Inc., Longmont, CO (US)

( * ) Notice: Subject to any disclaimer, the term of this patent is extended or adjusted under 35 U.S.C. 154(b) by 0 days.

(21) Appl. No.: 11/291,845

(22) Filed: Dec. 2, 2005

(51) Int. Cl.
*G03H 1/02* (2006.01)
(52) U.S. Cl. .................. 359/3; 369/103; 369/291.1
(58) Field of Classification Search ............. 359/3–8; 430/1–2; 369/291.1, 103
See application file for complete search history.

(56) References Cited

U.S. PATENT DOCUMENTS

| | | | |
|---|---|---|---|
| 4,329,409 A | 5/1982 | Wreede et al. | |
| 4,330,604 A | 5/1982 | Wreede et al. | |
| 4,789,211 A | 12/1988 | Wreede | |
| 4,808,500 A | 2/1989 | Wreede et al. | |
| 4,990,415 A * | 2/1991 | Yu | 430/2 |
| 5,095,375 A * | 3/1992 | Bolt | 359/1 |
| 5,138,469 A | 8/1992 | Wood et al. | |
| 5,172,250 A | 12/1992 | Tsuchiya et al. | |
| 5,219,710 A | 6/1993 | Horn et al. | |
| 5,276,537 A | 1/1994 | Savant et al. | |
| 5,331,444 A | 7/1994 | Biles et al. | |
| 5,932,045 A | 8/1999 | Campell et al. | |
| 6,103,454 A | 8/2000 | Dhar et al. | |
| 6,160,645 A * | 12/2000 | Chandross et al. | 359/3 |
| 6,482,551 B1 | 11/2002 | Dhar et al. | |
| 6,650,447 B2 | 11/2003 | Curtis et al. | |
| 6,671,073 B2 * | 12/2003 | Hegel | 359/3 |
| 6,743,552 B2 | 6/2004 | Setthachayanon et al. | |
| 6,765,061 B2 | 7/2004 | Dhar et al. | |
| 6,780,546 B2 | 8/2004 | Trentler et al. | |
| 6,804,034 B2 | 10/2004 | Edwards | |
| 2003/0206320 A1 | 11/2003 | Cole et al. | |
| 2003/0206329 A1 | 11/2003 | Cole et al. | |

(Continued)

OTHER PUBLICATIONS

Smothers et al., "Photopolymers for Holography," *SPIE OE/Laser Conference*, (Los Angeles, Calif., 1990), pp.: 1212-03.

(Continued)

*Primary Examiner*—Leonidas Boutsikaris
(74) *Attorney, Agent, or Firm*—Jagtiani + Guttag, LLP; Ajay A. Jagtiani; Eric W. Guttag

(57) ABSTRACT

The present invention relates to an article comprising: a pair of substrates comprising a thermoplastic; a holographic recording medium positioned between the substrates such that the holographic recording medium has at least one exposed area; and an environmental barrier seal protecting the at least one exposed area from environmental degradants; wherein the environmental barrier seal comprises: an inner layer adhered to at least one of the substrates and comprising a thermally meltable adhesive; an outer layer comprising a moisture impervious plastic; and an intermediate layer positioned between the inner and outer layers and comprising an moisture and oxygen impervious metallic foil. The present invention also provides a process for forming such an article.

37 Claims, 11 Drawing Sheets

U.S. PATENT DOCUMENTS

2004/0027625 A1 2/2004 Trentler et al.
2004/0165235 A1* 8/2004 Edwards et al. ............... 359/3

OTHER PUBLICATIONS

L. Dhar et al., "Recording Media That Exhibit High Dynamic Range for Holographic Storage," *Optics Letters*, 24, (1999): pp. 487 et. seq.

P. Hariharan, Optical Holography: Principles, Techniques and Applications, Cambridge University Press, Cambridge, 1991, at 44.

L. Solymar et al., *Volume Holography and Volume Gratings*, (Academic Press 1981), pp.: 315-327.

J. E. Ludman et al., "Very thick holographic nonspatial filtering of laser beams," *Optical Engineering*, 36, (6), (1997), pp.: 1700 et seq.

B. Booth, "Optical Interconnection Polymers," in *Polymers for Lightwave and Integrated Optics, Technology and Applications*, (L. A. Hornak, ed., Marcel Dekker, Inc. 1992).

* cited by examiner

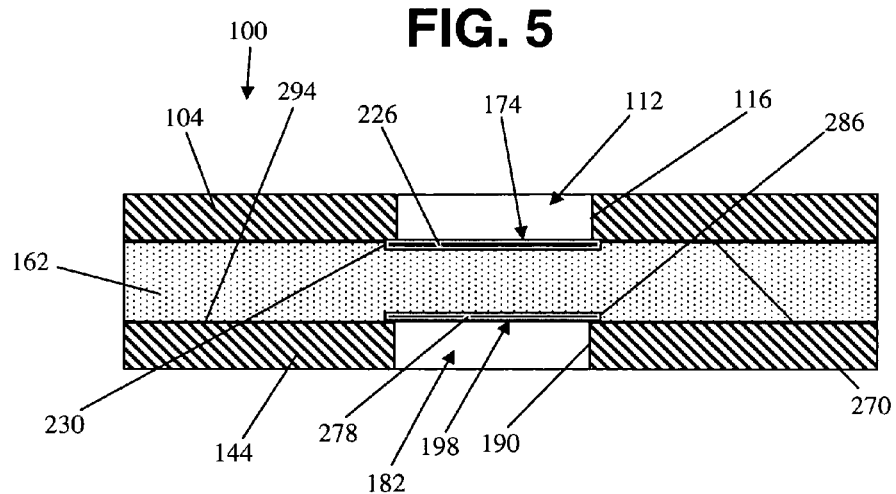
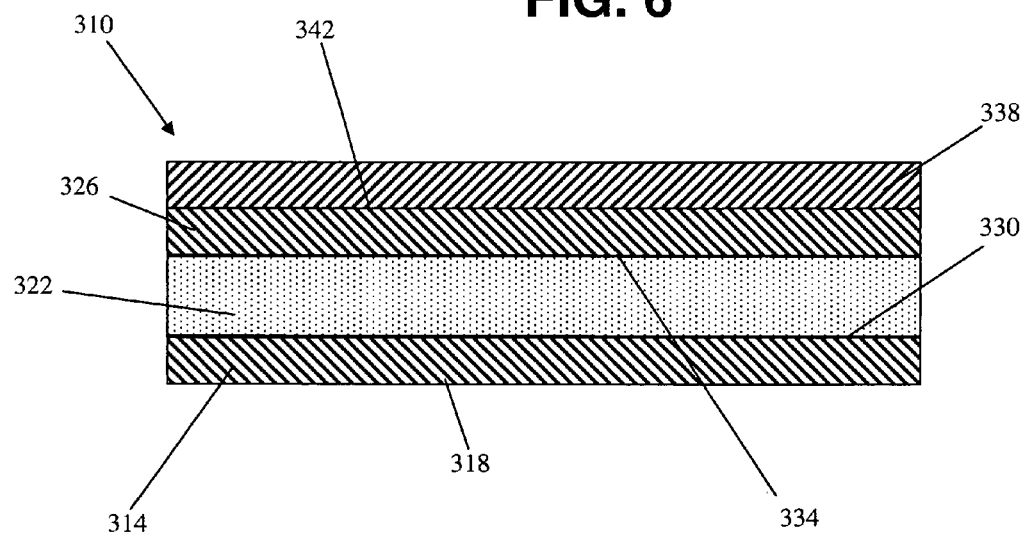

ARTICLE COMPRISING HOLOGRAPHIC MEDIUM BETWEEN SUBSTRATES HAVING ENVIRONMENTAL BARRIER SEAL AND PROCESS FOR PREPARING SAME

BACKGROUND

1. Field of the Invention

The present invention relates to an article comprising a holographic medium between a pair of substrates and having an environmental barrier seal, as well as a process for preparing same.

2. Related Art

Developers of information storage devices and methods continue to seek increased storage capacity. As part of this development, so-called page-wise memory systems, in particular holographic systems, have been suggested as alternatives to conventional memory devices. Page-wise systems involve the storage and readout of an entire two-dimensional representation, e.g., a page of data. Typically, recording light passes through a two-dimensional array of dark and transparent areas representing data, and the holographic system stores, in three dimensions, holographic representations of the pages as patterns of varying refractive index imprinted into a storage medium. Holographic systems are discussed generally in Psaltis et al., "Holographic Memories," *Scientific American*, November 1995.

The capabilities of typical holographic recording systems are determined in part by the storage medium. One type of holographic recording media used recently for such systems are photosensitive polymer films. See, e.g., Smothers et al., "Photopolymers for Holography," *SPIE OE/Laser Conference*, (Los Angeles, Calif., 1990), pp.: 1212–03. The holographic recording media described in Smothers et al., supra contain a photoimageable system containing a liquid monomer material (the photoactive monomer) and a photoinitiator (which promotes the polymerization of the monomer upon exposure to light), where the photoimageable system is in an organic polymer host matrix that is substantially inert to the exposure light. During writing (recording) of information into the material (by passing recording light through an array representing data), the monomer polymerizes in the exposed regions. Due to the lowering of the monomer concentration caused by the polymerization, monomer from the dark, unexposed regions of the material diffuses to the exposed regions. The polymerization and resulting diffusion create a refractive index change, thus forming the holographic grating (hologram) representing the data.

Photosensitive polymer films are considered attractive recording media candidates for high density holographic data storage. These films have a relatively low cost, are easily processed and can be designed to have large index contrasts with high photosensitivity. These films can also be fabricated with the dynamic range, media thickness, optical quality and dimensional stability required for high density applications. See L. Dhar et al., "Recording Media That Exhibit High Dynamic Range for Holographic Storage," *Optics Letters*, 24, (1999): pp. 487 et. seq.

The polymer materials used in the holographic recording medium are typically sandwiched between two glass or plastic plates or substrates to insure high optical quality. An area of disadvantage for these photopolymer films, even when sandwiched between glass or plastic substrates, is that the exposure to the various environmental factors can negatively affect the properties of these films. For example, exposure of these photopolymer films to an oxygen-containing environment (e.g., air), as well as moisture, may cause degradation of the photopolymer film, e.g., by reaction with the materials in the film, thus potentially causing permanent damage thereto. Such degradation may come in the form of reduced dynamic range of the photopolymer film and hence reduced storage of data, as well as reducing shelf life and archival life of the film.

Environmental exposure, specifically moisture, may also result in the photopolymer absorbing moisture, thus causing the photopolymer to swell and undergo refractive index changes in a spatially non-uniform fashion. When the photopolymer film is sandwiched between glass or plastic substrates, the non-uniform swelling and/or refractive index change in the polymer may diminish the optical quality of the holographic recording medium, e.g., by changing the optical properties of the film, including optical flatness. See, for example, U.S. Pat. No. 6,160,645 (Chandross et al.), issued Dec. 12, 2000 (hermetic seal comprising metal foils attached to plates having photosensitive polymer therebetween); and U.S. Pat. No. 6,671,073 (Hegel), issued Dec. 30, 2003 (holographic optical data storage device that includes photopolymer between upper and lower substrates having first and second peripheral edges respectively with an opening formed therebetween, and a connection member engaged to the upper and lower substrates wherein the connection member seals the opening).

Accordingly, what is needed is a way to protect a holographic recording medium sandwiched between such substrates against environmental factors, including moisture and oxygen, that can adversely affect the properties of the medium, including degradation of the dynamic range of the medium, as well as the optical quality of the medium.

SUMMARY

According to a first broad aspect of the present invention, there is provided an article comprising:

a pair of substrates each comprising a thermoplastic;

a holographic recording medium positioned between the substrates such that the holographic recording medium has at least one exposed area; and an environmental barrier seal protecting the at least one exposed area from environmental degradants;

wherein the environmental barrier seal comprises:

an inner layer adhered to at least one of the substrates and comprising a thermally meltable adhesive;

an outer layer comprising a moisture impervious plastic; and an intermediate layer positioned between the inner and outer layers and comprising a moisture and oxygen impervious metallic foil.

According to a second broad aspect of the present invention, there is provided a process comprising the following steps of:

(1) providing an article comprising:

a pair of substrates each comprising a thermoplastic; and a holographic recording medium positioned between the substrates such that the holographic recording medium has at least one exposed area; and (2) forming an environmental barrier seal to protect the at least one exposed area from environmental degradants, wherein the environmental barrier comprises:

an inner layer adhered to at least one of the substrates and comprising a thermally meltable adhesive;

an outer layer comprising a moisture impervious plastic; and an intermediate layer positioned between the inner and outer layers and comprising a moisture and oxygen impervious metallic foil.

BRIEF DESCRIPTION OF THE DRAWINGS

The invention will be described in conjunction with the accompanying drawings, in which:

FIG. 5 is a side sectional view of an alternative embodiment to that shown in FIG. 4;

FIG. 6 is a side sectional view of an embodiment of an environmental barrier seal according to the present invention;

DETAILED DESCRIPTION

Figure 1:
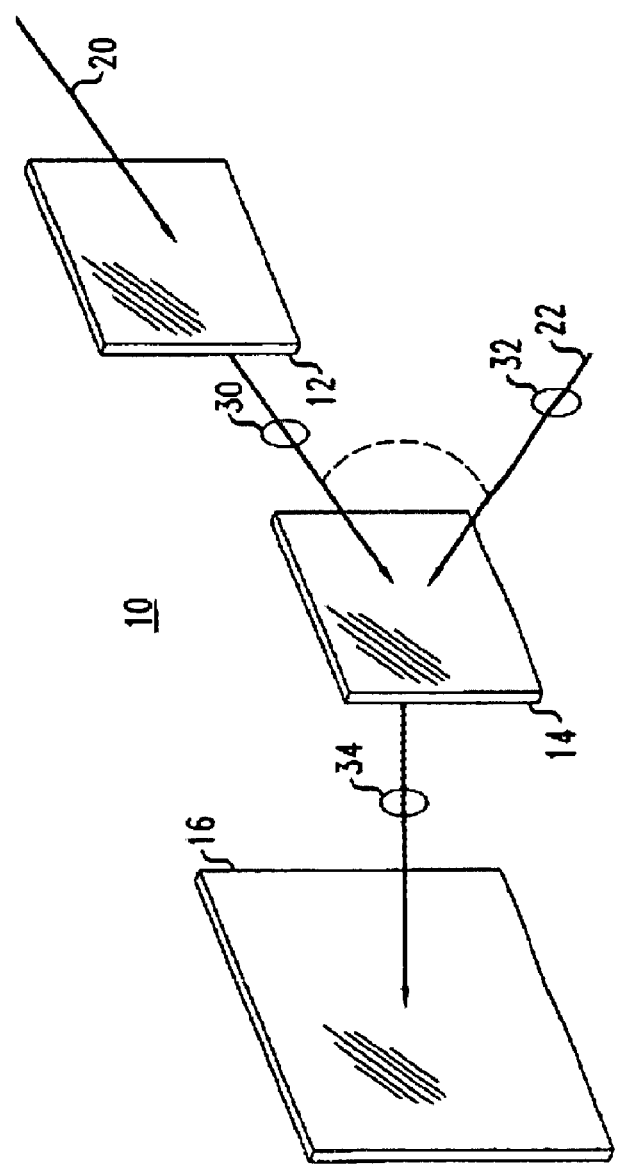
FIG. 1 shows a basic holographic storage system for recording holographs in a holographic recording medium.

It is advantageous to define several terms before describing the invention. It should be appreciated that the following definitions are used throughout this application.

Definitions

Where the definition of terms departs from the commonly used meaning of the term, applicants intend to utilize the definitions provided below, unless specifically indicated.

For the purposes of the present invention, the term "light source" refers to any source of electromagnetic radiation of any wavelength. In one embodiment, the light source of the present invention may be a laser of a particular wavelength.

For the purposes of the present invention, the term "photoinitiating light source" refers to a light source that activates a photoinitiator, a photoactive polymerizable material, or both. Photoiniating light sources include recording light, etc.

For the purposes of the present invention, the term "spatial light intensity" refers to a light intensity distribution or pattern of varying light intensity within a given volume of space.

For the purposes of the present invention, the terms "holographic grating," "holograph" or "hologram" (collectively and interchangeably referred to hereafter as "hologram") are used in the conventional sense of referring to a recorded interference pattern formed when a signal beam and a reference beam interfere with each other. In cases wherein digital data is recorded, the signal beam is encoded with a spatial light modulator.

For the purposes of the present invention, the term "holographic recording" refers to a hologram after it is recorded in the holographic recording medium.

For the purposes of the present invention, the term "holographic recording medium" refers to a component, material, etc., that is capable of recording and storing, in three dimensions (i.e., the X, Y and Z dimensions), one or more holograms as one or more pages as patterns of varying refractive index imprinted into the medium.

For the purposes of the present invention, the term "data page" or "page" refers to the conventional meaning of data page as used with respect to holography. For example, a data page may be a page of data, one or more pictures, etc., to be recorded or recorded in a holographic recording medium of the present invention.

For the purposes of the present invention, the term "recording light" refers to a light source used to record into a holographic medium. The spatial light intensity pattern of the recording light is what is recorded. Thus, if the recording light is a simple noncoherent beam of light, a waveguide may then be created, or if it is two interfering laser beams, then interference patterns will be recorded.

For the purposes of the present invention, the term "recording data" refers to storing holographic representations of one or more pages as patterns of varying refractive index.

For the purposes of the present invention, the term "reading data" refers to retrieving or recovering data stored as holographic representations.

For the purposes of the present invention, the term "substrate" refers to components, materials, etc., associated with the holographic recording medium, and that often provide a supporting structure for the holographic recording medium, and may optionally provide other beneficial properties for the article, e.g., rendering the holographic recording medium optically flat, etc. In one embodiment of the present invention, a holographic recording medium is located between a pair of substrates. In the various embodiments of the article of the present invention employing a pair of substrates, one or both substrates may be optically transparent depending on whether radiation used to write data (e.g., recording light) needs to be transmitted through the substrate to the holographic recording medium. Each substrate comprises a thermoplastic (in whole or in part) such that the environmental barrier seal can be adhered thereto, for example, by a heat sealing process. Each substrate may comprise a variety of thermoplastic materials, including those that are optically transparent to the radiation (e.g., recording light) used to write data, such as polycarbonates, poly(methyl methacrylate), cyclic olefin polymers, etc. Each substrate may also be optically opaque if transmission of radiation through the substrate to write data in the holographic recording medium is not required. Each substrate may have an antireflective coating that may be deposited or otherwise formed on the substrate by various processes known to those skilled in the art, such as chemical vapor deposition, etc. The substrate may consist essentially of thermoplastic (i.e., an entirely thermoplastic substrate), or may comprise other materials (e.g., glass) in addition to thermoplastic (e.g., a laminate of one or more layers of glass with one or more layers of thermoplastic).

For the purposes of the present invention, the term "support matrix" refers to a material, medium, substance, etc., in which a polymerizable component is dissolved, dispersed, embedded, enclosed, etc. The support matrix is typically a low $T_g$ polymer. The polymer may be organic, inorganic, or a mixture of the two. The polymer may also be either a thermoset or thermoplastic.

For the purposes of the present invention, the term "different form" refers to a product that is processed to produce a different physical form. For example, a holographic recording medium of the present invention comprising a block of material, powder of material, chips of material, etc. may be processed to form a molded product, a sheet, a free flexible film, a stiff card, a flexible card, an extruded film, etc.

For the purposes of the present invention, the term "particle material" refers to a material that is made by grinding, shredding, fragmenting or otherwise subdividing an article into smaller components or to a material that is comprised of small components such as a powder.

For the purposes of the present invention, the term "free flexible film" refers to a thin sheet of flexible material that maintains its form without being supported on an associated substrate. Examples of free flexible films include the various types of plastic wraps used in food storage.

For the purposes of the present invention, the term "stiff article' refers to an article that may crack or crease when bent. An example of a stiff article is a plastic credit card, a DVD, a transparency, wrapping paper, a shipping box, etc.

For the purposes of the present invention, the term "volatile compound" refers to any chemical with a high vapor pressure and/or a boiling point below about 150° C. Examples of volatile compounds include: acetone, methylene chloride, toluene, etc. An article, mixture or component is "volatile compound free" if the article, mixture or component does not include a volatile compound.

For the purposes of the present invention, the term "oligomer" refers to a polymer having approximately 30 repeat units or less or any large molecule able to diffuse at least about 100 nm in approximately 2 minutes at room temperature when dissolved in a holographic recording medium of the present invention. Such oligomers may contain one or more polymerizable groups whereby the polymerizable groups may be the same or different from other possible monomers in the polymerizable component. Furthermore, when more than one polymerizable group is present on the oligomer, they may be the same or different. Additionally, oligomers may be dendritic. Oligomers are considered herein to be photoactive monomers, although they are sometimes referred to as "photoactive oligomer(s)".

For the purposes of the present invention, the term "photopolymerization" refers to any polymerization reaction caused by exposure to a photoinitiating light source.

For the purposes of the present invention, the term "free radical polymerization" refers to any polymerization reaction that is initiated by any molecule comprising a free radical or radicals.

For the purposes of the present invention, the term "cationic polymerization" refers to any polymerization reaction that is initiated by any molecule comprising a cationic moiety or moieties.

For the purposes of the present invention, the term "anionic polymerization" refers to any polymerization reaction that is initiated by any molecule comprising an anionic moiety or moieties.

For the purpose of the present invention, the term "photoinitiator" refers to the conventional meaning of the term photoinitiator and also refers to sensitizers and dyes. In general, a photoinitiator causes the light initiated polymerization of a material, such as a photoactive oligomer or monomer, when the material containing the photoinitiator is exposed to light of a wavelength that activates the photoinitiator, i.e., a photoinitiating light source. The photoinitiator may refer to a combination of components, some of which individually are not light sensitive, yet in combination are capable of curing the photoactive oligomer or monomer, examples of which include a dye/amine, a sensitizer/iodonium salt, a dye/borate salt, etc.

For the purposes of the present invention, the term "photoinitiator component" refers to a single photoinitiator or a combination of two or more photoinitiators. For example, two or more photoinitiators may be used in the photoinitiator component to allow recording at two or more different wavelengths of light.

For the purposes of the present invention, the term "polymerizable component" refers to a mixture of one or more photoactive polymerizable materials, and possibly one or more additional polymerizable materials (i.e., monomers and/or oligomers) that are capable of forming a polymer.

For the purposes of the present invention, the term "photoactive polymerizable material" refers to a monomer, an oligomer and combinations thereof that polymerize in the presence of a photoinitiator that has been activated by being exposed to a photoinitiating light source, e.g., recording light. In reference to the functional group that undergoes curing, the photoactive polymerizable material comprises at least one such functional group. It is also understood that there exist photoactive polymerizable materials that are also photoinitiators, such as N-methylmaleimide, derivatized acetophenones, etc. In such a case, it is understood that the photoactive monomer and/or oligomer of the present invention may also be a photoinitiator.

For the purposes of the present invention, the term "photopolymer" refers to a polymer formed by one or more photoactive polymerizable materials, and possibly one or more additional monomers and/or oligomers.

For the purposes of the present invention, the term "plasticizer" refers to the conventional meaning of the term plasticizer. In general, a plasticizer is a compound added to a polymer both to facilitate processing and to increase the flexibility and/or toughness of a product by internal modification (solvation) of a polymer molecule.

For the purposes of the present invention, the term "thermoplastic" refers to the conventional meaning of thermoplastic, i.e., a composition, compound, material, medium, substance, etc., that exhibits the property of a material, such as a high polymer, that softens when exposed to heat and generally returns to its original condition when cooled to room temperature. Examples of thermoplastics include, but are not limited to: poly(methyl vinyl ether-alt-maleic anhydride), poly(vinyl acetate), poly(styrene), poly(ethylene), poly(propylene), cyclic olefin polymers, poly(ethylene oxide), linear nylons, linear polyesters, linear polycarbonates, linear polyurethanes, etc.

For the purposes of the present invention, the term "room temperature thermoplastic" refers to a thermoplastic that is solid at room temperature, i.e., will not cold flow at room temperature.

For the purposes of the present invention, the term "room temperature" refers to the commonly accepted meaning of room temperature, i.e., an ambient temperature of 20°–25° C.

For the purposes of the present invention, the term "thermoset" refers to the conventional meaning of thermoset, i.e., a composition, compound, material, medium, substance, etc., that is crosslinked such that it does not have a melting temperature. Examples of thermosets are crosslinked poly(urethanes), crosslinked poly(acrylates), crosslinked poly(styrene), etc.

For the purposes of the present invention, the term "exposed area" refers to those portions of the holographic recording medium, "slip layers", etc., that would be exposed to environmental degradants in the absence environmental barrier seals.

For the purposes of the present invention, the term "environmental degradant" refers at least to moisture, oxygen (e.g., in air), or combinations thereof.

For the purposes of the present invention, the term "relative humidity" (RH) refers to the percentage relation between the actual amount of water vapor in a given volume of air at a definite temperature and the maximum amount of water vapor that would be present if the air environment were saturated with water vapor at that temperature. RH is typically measured herein at temperatures of about 60° C. or higher, more typically about 80° C. or higher.

For the purposes of the present invention, the term "environmental barrier seal" refers to a seal that is protective against environmental degradants, i.e., has a relatively low water vapor transmission rate and/or oxygen transmission rate, especially in environments having relatively high RHs (e.g., about 90% or greater, more typically about 95% or greater), and comprises a plurality of layers, including a thermally meltable adhesive-comprising layer, a moisture impervious plastic-comprising layer, and a metallic foil-comprising layer positioned between the thermally meltable adhesive-comprising layer and the moisture impervious plastic-comprising layer. Usually, the environmental barrier seal provides effective protection again environment degradants at temperatures of about 38° C. or higher, typically about 60° C. or higher, more typically about 80° C. or higher, at a relative humidity of about 90% or greater, more typically about 95% or greater, and for time periods of about 200 hours or greater, more typically about 1000 hours or greater. The thickness of the environmental barrier seal typically depends upon the bulk or stock material (e.g., foil barrier laminate material) that the seal is formed from. Usually, the environmental barrier seal has a thickness of up to about 10 mils (254 microns) or less, and typically in the range of from about 3 to about 10 mils (from about 76 to about 254 microns), more typically from about 4 to about 5 mm (from about 102 to about 127 microns).

For the purposes of the present invention, the term "laminate" refers to one or more layers that are united as a composite. In at least some embodiments, the layer(s) are typically superimposed. Laminate materials usefully in forming environmental barrier seals are referred to herein as "foil barrier laminates" or "foil environmental barrier laminates," and may be provided in bulk or stock form as sheets, webs, films, etc. Illustrative foil barrier laminates for use herein include but are not limited to: PAKVF4 (provided by Impak Corp. of Los Angeles Calif.), MarvelSeal 360 and MarvelSeal FR2175 (provided by Ludlow Coated Products of Horner, La.), etc.

For the purposes of the present invention, the term "adhered" refers to one material (e.g., seal, layer, substrate, medium, etc.) being glued, fused, bonded, attached, etc., to another material (e.g., seal, layer, substrate, medium, etc.) at an edge, surface, or other interface between the materials.

For the purposes of the present invention, the term "adhesive" refers to a composition, substance, film, etc., that is capable of gluing, fusing, bonding, attaching, etc., one material (e.g., seal, layer, substrate, medium, etc.) to another material (e.g., seal, layer, substrate, medium, etc.) at an edge, surface, or other interface between the materials.

For the purposes of the present invention, the term "thermally meltable adhesive" refers to an adhesive material that melts or is molten upon heating (e.g., is heat sealable), typically at a temperature of about 150° C. or higher, more typically at a temperature of about 175° C. or higher. Suitable thermally meltable adhesives include one or more materials such as thermoplastic films comprising one or more of polyethylene, including low density polyethylene (LDPE) and linear low density polyethylene (LLDPE), polypropylene, copolymers of ethylene and propylene, terpolymers of ethylene, vinyl acetate and maleic anhydride, terpolymers of ethylene, vinyl acetate and acrylic acid polyester, ethylene vinyl acetate copolymers, ethylene methyl acrylate copolymers, ethylene butyl acrylate copolymers, etc.

For the purposes of the present invention, the term "metallic foil" refers to a relatively thin sheet, piece, etc., comprising one or more layers of metal or a metal alloy. Suitable metallic foils may comprise aluminum foil, stainless steel foil, gold foil, platinum foil, palladium foil, zinc foil, etc., as well as alloys thereof. Metallic foils useful herein, for example, aluminum foils, typically have a thickness of at least about 0.25 mils (6.3 microns), and typically from about 0.25 to about 0.4 mm (from about 6.3 to about 10.1 microns), more typically from about 0.28 to about 0.35 mils (from about 7.1 to about 8.9 microns).

For the purposes of the present invention, the term "tie layer" refers to an adhesive layer (e.g., a self-adhesive layer, a thermally meltable adhesive layer, etc.) between two other layers that attaches, adheres, glues, fuses, bonds, etc., these other layers to one another. Tie layers may be used to attach, adhere, glue, fuse, bond, etc., two layers together that are otherwise difficult to adhere together or cannot be adhered to another because of differing compositions (e.g., one layer is plastic, the other layer is metallic), differing coefficients of thermal expansion, differing coefficients of friction or adhesion, etc. Suitable tie layers may be comprised of one or more adhesive materials, one or more film-forming thermoplastic polymeric materials, or combinations of adhesive and film-forming thermoplastic polymeric materials. These adhesive materials may include ethylene vinyl acetate copolymers, ethylene methyl acrylate copolymers, ethylene butyl acrylate copolymers, etc., as well as combinations thereof. An example of a commercially available material that may be used is an ethylene methyl acrylate copolymer available from Exxon Mobil under the trade designation Optema TC 120. The film-forming thermoplastic polymeric materials that may be used include low density polyethylene (LDPE) and linear low density polyethylene (LLDPE), medium density polyethylene (density of about 0.924 to about 0.939 g/cc), polypropylene, copolymers of ethylene and propylene, terpolymers of ethylene, vinyl acetate and maleic anhydride, terpolymers of ethylene, vinyl acetate and acrylic acid, etc., as well as various combinations thermoplastics. An example of a commercial thermoplastic polymeric material that may be used is Union Carbide-Dow 5A97.

For the purposes of the present invention, the term "water vapor transmission rate" (WVTR) refers to the rate at which water vapor or moisture passes through or is transmitted through a environmental barrier material such as a layer, film, laminate, seal, etc., and may be a function of the size and frequency of the micropores in the layer, film, laminate, seal, etc. A normalized value may be used to compare the respective WVTR of various layers, film, laminates, seals, etc. One method that may be used to define WVTR is by ASTM F1249 (e.g., at 38° C. and 90% RH).

For the purposes of the present invention, the term "moisture impervious" refers to the ability of a material, laminate, film, layer, seal, etc., to reduce, inhibit, prevent, etc., the transmission of water vapor or moisture therethrough. Materials, laminates, films, layers, seals, etc., useful herein that are moisture impervious have a relatively low or minimal WVTR, typically of about 0.02 g./100 in.$^2$/day or less, more typically about 0.005 g./100 in.$^2$/day or less, as measured by ASTM F1249.

For the purposes of the present invention, the term "moisture impervious plastic" refers to a thermoplastic polymer that is moisture impervious and may be flexible (e.g., can be formed as a film). Suitable moisture impervious plastics for use herein include one or more of polyesters and copolyesters (e.g., polyethylene terephthalate (PET), etc.), polypropylene, polytetrafluoroethylene (e.g., Teflon, etc.), nylon, polystyrene, polycarbonate, acrylonitrile, polyvinyl chloride (PVC), polyvinyl dichloride (PVDC), ethylene vinyl alcohol (EVOH), polyvinylidene chloride (e.g., saran, etc.), ionomer-based polymers (e.g., Surlyn, etc.), polyethylene (e.g., HDPE, LDPE, etc.), etc., as well as blends and combinations of these plastics.

For the purposes of the present invention, the term "oxygen permeability" refers to the ability of a material, laminate, film, layer, seal, etc., to permit, allow, etc., the transmission of oxygen therethrough. Oxygen permeability may be measured in accordance with ASTM D3985-81, ASTM D1434, or DIN 53380 at an $O_2$ concentration of 1% at 1 atmosphere and 23° C.

For the purposes of the present invention, the term "oxygen impervious" refers to the ability of a material, laminate, film, layer, seal, etc., to reduce, inhibit, prevent, etc., the rate of transmission of oxygen therethrough. Materials, laminates, films, layers, environmental barrier seals, etc., useful herein that are oxygen impervious have a relatively low or minimal oxygen permeability rate, typically of about 10 cc/100 in.$^2$/day or less, more typically about 1 cc/100 in.$^2$/day or less.

For the purposes of the present invention, the term "isotropic" is used to describe the ability of a material, medium, etc., to physically expand or contract equally or substantially equally in all linear directions or dimensions, i.e., the X, Y and Z directions or dimensions, in response to thermally-induced changes, i.e., changes in temperature.

For the purposes of the present invention, the term "anisotropic" is used to describe a material, medium, etc., whose physical expansion or contraction in response to thermally-induced changes, i.e., changes in temperature, varies in one or more linear directions or dimensions, i.e., the response to thermally-induced changes is not equal in the X, Y and Z directions or dimensions.

For the purposes of the present invention, the term "X-Y plane" typically refers to the plane defined by the substrates or the holographic recording medium that encompasses the X and Y linear directions or dimensions. The X and Y linear directions or dimensions are typically referred to herein, respectively, as the dimensions known as length (i.e., the X-dimension) and width (i.e., the Y-dimension).

For the purposes of the present invention, the terms "Z-direction" and "Z-dimension" refer interchangeably to the linear dimension or direction perpendicular to the X-Y plane, and is typically referred to herein as the linear dimension known as thickness. The Z-direction/dimension is typically used herein with reference to the physical expansion or contraction of the holographic recording medium in response to thermally-induced changes, i.e., changes in temperature.

For the purposes of the present invention, the terms "coefficient of thermal expansion" and "coefficient of linear expansion" (collectively and interchangeably referred to hereafter as "CTE") are used to refer to the relative expansion and/or contraction of a material, medium, etc., in one or more linear directions or dimensions in response to temperature, or changes in temperature. All CTE values referred to herein are in terms of ppm per ° C. unless otherwise indicated. For example, a CTE value of "240" means "240 ppm per ° C."

For the purposes of the present invention, the terms "differs in CTE values," "difference in CTE values" and the like refer to a measurable difference between the CTE value of the holographic recording medium and the CTE value of the associated substrate such that the holographic recording medium exhibits anisotropic or substantially anisotropic behavior.

For the purposes of the present invention, the term "CTE compensating interface" refers to any interface between the holographic recording medium and an associated substrate that adjusts for, adjusts to, corrects for, or otherwise compensates for differences in the CTE values between the holographic recording medium and the associated substrate so that the holographic recording medium exhibits more isotropic behavior (i.e., has less anisotropic behavior) relative to changes in temperature. A CTE compensating interface often "decouples" the CTE properties of the holographic recording medium from the CTE properties of the associated substrate such that the holographic recording medium and associated substrate respond, function, etc., independently or substantially independently with respect to CTE effects, e.g., those caused by changes in temperature, etc.

For the purposes of the present invention, the term "interface," with regard to the term "CTE compensating interface," may refer to a boundary, layer, zone, region, area, etc.

Description of Holographic Systems and Recording Medium

FIG. 1 illustrates the basic components of a holographic system 10 for recording such holograms in a holographic recording medium. System 10 contains a modulating device 12, a photorecording medium 14, and a sensor 16. Modulating device 12 is any device capable of optically representing data in two-dimensions. Device 12 may be a spatial light modulator that is attached to an encoding unit that encodes data onto the modulator. Based on the encoding, device 12 selectively passes or blocks portions of a signal beam 20 passing through device 12. In this manner, beam 20 is encoded with a data image. The image is stored by interference of the encoded signal beam 20 with a reference beam 22 at a location on or within photorecording medium 14. The interference creates an interference pattern (or hologram) that is captured within medium 14 as a pattern of, for example, varying refractive index. It is possible for more than one holographic image to be stored at a single location, or for holograms to be stored in overlapping positions, by, for example, varying the angle, the wavelength, or the phase of the reference beam 22, depending on the particular reference beam employed. Signal beam 20 typically passes through lens 30 before being intersected with reference beam 22 in medium 14. It is possible for reference beam 22 to pass through lens 32 before this intersection. Once data is stored in medium 14, it is possible to retrieve the data by intersecting reference beam 22 with medium 14 at the same location and at the same angle, wavelength, or phase at which reference beam 22 was directed during storage of the data. The reconstructed data passes through lens 34 and is detected by sensor 16. Sensor 16 is, for example, a charge coupled device or an active pixel sensor. Sensor 16 may be attached to a unit that decodes the data.

As discussed above, formation of a hologram relies on a refractive index contrast ($\Delta n$) between exposed and unexposed regions of a medium, this contrast being at least partly due to monomer/oligomer diffusion to exposed regions. High index contrast is generally desired because it provides improved signal strength when reading a hologram, and provides efficient confinement of an optical wave in a waveguide. One way to provide high index contrast is to use a photoactive monomer/oligomer having moieties (referred to as index-contrasting moieties) that are substantially absent from the support matrix, and that exhibit a refractive index substantially different from the index exhibited by the bulk of the support matrix. For example, high contrast may be obtained by using a support matrix that contains primarily aliphatic or saturated alicyclic moieties with a low concentration of heavy atoms and conjugated double bonds (providing low index) and a photoactive monomer/oligomer made up primarily of aromatic or similar high-index moieties.

The holographic recording medium is formed such that holographic writing to and reading from the medium are possible. In at least some embodiments, fabrication of the holographic recording medium involves depositing a combination, blend, mixture, etc., of the support matrix/polymerizable component/photoinitiator component on a support structure, such as a pair of (i.e., two) substrates, and using, for example, a gasket to contain the mixture. It is possible to use spacers between the substrates to maintain a desired thickness for the recording medium. In applications requiring optical flatness, the liquid mixture may shrink during cooling (if a thermoplastic) or curing (if a thermoset) and thus distort the optical flatness of the article. To reduce such effects, it is useful to place the holographic recording medium between substrates in an apparatus containing mounts, e.g., vacuum chucks, capable of being adjusted in response to changes in parallelism and/or spacing. In such an apparatus, it is possible to monitor the parallelism in real-time by use of conventional interferometric methods, and to make any necessary adjustments to the heating/cooling process. During formation, the holographic recording medium may be supported in other ways other than by use of a substrate or substrates. More conventional polymer processing is also envisioned, e.g., closed mold formation or sheet extrusion. A stratified article is also contemplated, i.e., a plurality of holographic recording medium layers disposed between respective substrates.

A holographic recording medium that is formed is then capable of being used in a holographic system such as discussed previously. The amount of information capable of being stored in a holographic recording medium is proportional to the product of: the refractive index contrast, $\Delta n$, of the photorecording material, and the thickness, d, of the photorecording material. (The refractive index contrast, $\Delta n$, is conventionally known, and is defined as the amplitude of the sinusoidal variations in the refractive index of a material in which a plane-wave, volume hologram has been written. The refractive index varies as: $n(x)=n_0+\Delta n \cos(K_x)$, where $n(x)$ is the spatially varying refractive index, x is the position vector, K is the grating wave vector, and $n_0$ is the baseline refractive index of the medium. See, e.g., P. Hariharan, *Optical Holography: Principles, Techniques and Applications*, Cambridge University Press, Cambridge, 1991, at 44, the disclosure of which is hereby incorporated by reference.) The $\Delta n$ of a material may be calculated from the diffraction efficiency or efficiencies of a single volume hologram or a multiplexed set of volume holograms recorded in a medium. The $\Delta n$ is associated with a medium before writing, but is observed by measurement performed after recording. Advantageously, the photorecording material of the invention exhibits a $\Delta n$ of $3\times10^{-3}$ or higher.

Examples of other optical articles include beam filters, beam steerers or deflectors, and optical couplers. (See, e.g., L. Solymar et al., *Volume Holography and Volume Gratings*, (Academic Press 1981), pp.: 315–27), the disclosure of which is hereby incorporated by reference.) A beam filter separates part of an incident laser beam that is traveling along a particular angle from the rest of the beam. Specifically, the Bragg selectivity of a thick transmission hologram is able to selectively diffract light along a particular angle of incidence, while light along other angles travels undeflected through the hologram. (See, e.g., J. E. Ludman et al., "Very thick holographic nonspatial filtering of laser beams," *Optical Engineering*, 36, (6), (1997), pp.: 1700 et seq., the disclosure of which is hereby incorporated by reference.) A beam steerer is a hologram that deflects light incident at the Bragg angle. An optical coupler is typically a combination of beam deflectors that steer light from a source to a target. These articles, typically referred to as holographic optical elements, are fabricated by imaging a particular optical interference pattern within a recording medium, as discussed previously with respect to data storage. Media for these holographic optical elements are capable of being formed by the techniques discussed herein for recording media or waveguides.

The material principles discussed herein are applicable not only to hologram formation, but also to formation of optical transmission devices such as waveguides. Polymeric optical waveguides are discussed for example in B. Booth, "Optical Interconnection Polymers," in *Polymers for Lightwave and Integrated Optics, Technology and Applications*, (L. A. Hornak, ed., Marcel Dekker, Inc. 1992); U.S. Pat. No. 5,292,620 (Booth et al.), issued Mar. 18, 1994; and U.S. Pat. No. 5,219,710 (Horn et al.), issued Jun. 15, 1993, the disclosures of which are hereby incorporated by reference. Essentially, the recording material is irradiated in a desired waveguide pattern to provide refractive index contrast between the waveguide pattern and the surrounding (cladding) material. It is possible for exposure to be performed, for example, by a focused laser light or by use of a mask with a non-focused light source. Generally, a single layer is exposed in this manner to provide the waveguide pattern, and additional layers are added to complete the cladding, thereby completing the waveguide. This process is discussed for example at pages 235–36 of Booth, supra, and Cols. 5 and 6 of U.S. Pat. No. 5,292,620, supra, the disclosure of which is hereby incorporated by reference.

In one embodiment of a holographic recording medium, it is possible to use conventional molding techniques to mold the combination, blend, mixture, etc., of the support matrix/polymerizable component/photoinitiator component into a variety of shapes prior to formation of the article by cooling to room temperature. For example, the combination, blend, mixture, etc., of the support matrix/polymerizable component/photoinitiator component can be molded into ridge waveguides, wherein a plurality of refractive index patterns are then written into the molded structures. It is thereby possible to easily form structures such as Bragg gratings. This feature increases the breadth of applications in which such polymeric waveguides would be useful.

In another embodiment of a holographic recording medium, the support matrix may be thermoplastic and allow the holographic recording medium to behave as if it is entirely a thermoplastic. That is, the support matrix allows the holographic recording medium to be processed similar to the way that a thermoplastic is processed, i.e., molded into a shaped form, blown into a film, deposited in liquid form between a pair of substrates, extruded, rolled, pressed, made into a sheet of material, etc., and then allowed to harden at room temperature to take on a stable shape or form. The support matrix may comprise one or more thermoplastics. Suitable thermoplastics include poly(methyl vinyl ether-alt-maleic anhydride), poly(vinyl acetate), poly(styrene), poly(ethylene), poly(propylene), poly(ethylene oxide), linear nylons, linear polyesters, linear polycarbonates, linear polyurethanes, poly(vinyl chloride), poly(vinyl alcohol-co-vinyl acetate).

In another embodiment, the amount of thermoplastic used in the holographic recording medium may be enough that the entire holographic recording medium effectively acts as a thermoplastic for most processing purposes. The binder component of the holographic recording medium may make up as much as about 5%, preferably as much as about 50%, and more preferably as much as about 90% of the holographic recording medium by weight. The amount of any given support matrix in the holographic recording medium may vary based on clarity, refractive index, melting temperature, $T_g$, color, birefringence, solubility, etc. of the thermoplastic or thermoplastics that make up the binder component. Additionally, the amount of the support matrix in the holographic recording medium may vary based on the article's final form, whether it is a solid, a flexible film, or an adhesive.

In another embodiment of the holographic recording medium, the support matrix may include a telechelic thermoplastic resin—meaning that the thermoplastic polymer may be functionalized with reactive groups that covalently crosslink the thermoplastic in the support matrix with the polymer formed from the polymerizable component during hologram formation. Such crosslinking makes the holograms stored in the thermoplastic holographic recording medium very stable, even to elevated temperatures for extended periods of time.

Similarly, in another embodiment of the holographic recording medium wherein a thermoset is formed, the matrix may contain functional groups that copolymerize or otherwise covalently bond with the monomer used to form the photopolymer. Such matrix attachment methods allow for increased archival life of the recorded holograms. Suitable thermoset systems for used herein are disclosed in to U.S. Pat. No. 6,482,551 (Dhar et al.), issued Nov. 19, 2002, the entire contents and disclosure of which are incorporated herein by reference.

In another embodiment of the holographic recording medium, the thermoplastic support matrix may be crosslinked noncovalently with the polymer formed upon hologram formation by using a functionalized thermoplastic polymer in the support matrix. Examples of such non-covalent bonding include ionic bonding, hydrogen bonding, dipole—dipole bonding, aromatic pi stacking, etc.

In another embodiment, the holographic recording medium comprises a polymerizable component that includes at least one photoactive polymerizable material that can form holograms made of a polymer or co-polymer when exposed to a photoinitiating light source, such as a laser beam that is recording data pages to the holographic recording medium. The photoactive polymerizable materials may include any monomer, oligomer, etc., that is capable of undergoing photoinitiated polymerization, and which, in combination with the support matrix, meets the compatibility requirements of the present invention. Suitable photoactive polymerizable materials include those which polymerize by a free-radical reaction, e.g., molecules containing ethylenic unsaturation such as acrylates, methacrylates, acrylamides, methacrylamides, styrene, substituted styrenes, vinyl naphthalene, substituted vinyl naphthalenes, other vinyl derivatives, etc. Free-radical copolymerizable pair systems such as vinyl ether/maleimide, vinyl ether/thiol, acrylate/thiol, vinyl ether/hydroxy, etc., are also suitable. It is also possible to use cationically polymerizable systems; a few examples are vinyl ethers, alkenyl ethers, allene ethers, ketene acetals, epoxides, etc. Furthermore, anionic polymerizable systems are also suitable herein. It is also possible for a single photoactive polymerizable molecule to contain more than one polymerizable functional group. Other suitable photoactive polymerizable materials include cyclic disulfides and cyclic esters. Oligomers that may be included in the polymerizable component to form a holographic grating upon exposure to a photoinitiating light source include oligomers such as oligomeric (ethylene sulfide) dithiol, oligomeric (phenylene sulfide) dithiol, oligomeric (bisphenol A), oligomeric (bisphenol A) diacrylate, oligomeric polyethylene with pendent vinyl ether groups, etc. The photoactive polymerizable material of the polymerizable component of holographic recording medium may be monofunctional, difunctional, and/or multifunctional.

In addition to the at least one photoactive polymerizable material, the holographic recording medium may contain a photoinitiator. The photoinitiator, upon exposure to relatively low levels of the recording light, chemically initiates the polymerization of the at least one photoactive polymerizable material, thus avoiding the need for direct light-induced polymerization. The photoinitiator generally should offer a source of species that initiate polymerization of the particular photoactive polymerizable material, e.g., photoactive monomer. Typically, from about 0.1 to about 20 vol. % photoinitiator provides desirable results.

A variety of photoinitiators known to those skilled in the art and available commercially are suitable for use in the holographic recording medium. It is advantageous to use a photoinitiator that is sensitive to light at wavelengths available from conventional laser sources, e.g., the blue and green lines of $Ar^+$ (458, 488, 514 nm) and He—Cd lasers (442 nm), the green line of frequency doubled YAG lasers (532 nm), and the red lines of He—Ne (633 nm), $Kr^+$ lasers (647 and 676 nm), and various diode lasers (290 to 900 nm). One advantageous free radical photoinitiator is bis($\eta$-5-2,4-cyclopentadien-1-yl)bis [2,6-difluoro-3-(1H-pyrrol-1-yl) phenyl]titanium, available commercially from Ciba as Irgacure 784™. Another visible free-radical photoinitiator (which requires a co-initiator) is 5,7-diiodo-3-butoxy-6-fluorone, commercially available from Spectra Group Limited as H-Nu 470. Free-radical photoinitiators of dye-hydrogen donor systems are also possible. Examples of suitable dyes include eosin, rose bengal, erythrosine, and methylene blue, and suitable hydrogen donors include tertiary amines such as n-methyl diethanol amine. In the case of cationically polymerizable components, a cationic photoinitiator is used, such as a sulfonium salt or an iodonium salt. These cationic photoinitiator salts absorb predominantly in the UV portion of the spectrum, and are therefore typically sensitized with a sensitizer or dye to allow use of the visible portion of the spectrum. An example of an alternative visible cationic photoinitiator is ($\eta_5$-2,4-cyclopentadien-1-yl) ($\eta_6$-isopropylbenzene)-iron(II) hexafluorophosphate, available commercially from Ciba as Irgacure 261.

In most embodiments of the holographic recording medium, the photoinitiators used are sensitive to ultraviolet and visible radiation of from about 200 nm to about 800 nm.

The holographic recording medium may also include additives such as plasticizers for altering the properties thereof including the melting point, flexibility, toughness, diffusibility of the monomers, ease of processibililty, etc. Examples of suitable plasticizers include dibutyl phthalate, poly(ethylene oxide)methyl ether, N,N-dimethylformamide, etc. Plasticizers differ from solvents in that solvents are typically evaporated whereas plasticizers are meant to remain in the holographic recording medium.

Other types of additives that may be used in the liquid mixture of the holographic recording medium are inert diffusing agents having relatively high or low refractive indices. Inert diffusing agents typically diffuse away from the hologram being formed, and can be of high or low refractive index but are typically low. Thus, when the monomer is of high refractive index, the inert diffusing agent would be of low refractive index, and ideally the inert diffusing agent diffuses to the nulls in an interference pattern. Overall, the contrast of the hologram is increased. Other additives that may be used in the liquid mixture of the holographic recording medium include: pigments, fillers, nonphotoinitiating dyes, antioxidants, bleaching agents, mold releasing agents, antifoaming agents, infrared/microwave absorbers, surfactants, adhesion promoters, etc.

In one embodiment of the holographic recording medium, the polymerizable component comprises less than about 20 volume %. In other embodiments, the polymerizable component of the holographic recording medium may be less than about 10 volume %, or even less than about 5 volume %. For data storage applications, the polymerizable component is typically present at about 5 volume %.

In one embodiment, the holographic recording medium may be used to store volatile holograms. Due to the ability to control the photopolymer chain length in the holographic recording medium, a particular mixture may be tuned to have a very general lifetime for the recorded holograms. Thus, after hologram recording, the holograms may be readable for a defined time period such as a week, a few months, or years. Heating the holographic recording medium may also increase such a process of hologram destruction. Examples of applications for using volatile holograms include: rental movies, security information, tickets (or season passes), thermal history detector, time stamp, and/or temporary personal records, etc.

In one embodiment, the holographic recording medium may be used to record permanent holograms. There are several methods to increase the permanency of recorded holograms. Many of these methods involve placing functional groups on the support matrix that allow for the attachment of photopolymer to the support matrix during cure. The attachment groups can be vinyl unsaturations, chain transfer sites, or even a polymerization retarder such as a BHT derivative. Otherwise, for increased archival stability of recorded holograms, a multifunctional monomer should be used which allows for crosslinking of the photopolymer, thus increasing the entanglement of the photopolymer in the support matrix. In one embodiment of holographic recording medium, both a multifunctional monomer and a support matrix-attached retarder are used. In this way, the shorter chains that are caused by the polymerization retarder do not cause loss of archival life.

In addition to the photopolymeric systems described above, various photopolymeric systems may be used in the holographic recording mediums of the present invention. For example, suitable photopolymeric systems for use herein are also described in: U.S. Pat. No. 6,103,454 (Dhar et al.), issued Aug. 15, 2000; U.S. Pat. No. 6,482,551 (Dhar et al.), issued Nov. 19, 2002; U.S. Pat. No. 6,650,447 (Curtis et al.), issued Nov. 18, 2003, U.S. Pat. No. 6,743,552 (Setthachayanon et al.), issued Jun. 1, 2004; U.S. Pat. No. 6,765,061 (Dhar et al.), Jul. 20, 2004; U.S. Pat. No. 6,780,546 (Trentler et al.), Aug. 24, 2004; U.S. Patent Application No. 2003-0206320, published Nov. 6, 2003, (Cole et al), and U.S. Patent Application No. 2004-0027625, published Feb. 12, 2004, the entire contents and disclosures of which are herein incorporated by reference.

Description of Articles

The present invention is directed broadly at articles that comprise: (a) a pair of substrates comprising a thermoplastic; (2) a holographic recording medium (as previously described) positioned between the substrates and having at least one exposed area; and (3) one or more environmental barrier seals to protect the at least one exposed area. If such environmental barrier seals are absent, moisture and/or oxygen can enter through the exposed areas, such as through the peripheral edge of the article and/or though an aperture or hole proximate the center or central portion of the article that may be formed during manufacture thereof. Exposure of the holographic recording medium to oxygen and especially moisture may cause: (1) degradation of the medium, thus reducing the dynamic range and data storage, as well as reducing the shelf and archival life of the medium; and/or (2) swelling of the medium and changes in refractive index in a spatially non-uniform fashion, thus potentially diminishing the optical quality of the holographic recording medium, e.g., by changing the optical properties of the film, including optical flatness.

To successfully manufacture holographic data storage articles that avoid these problems, environmental barrier seals for the potentially exposed areas of the medium between the pair of substrates are provided by the present invention, as well as processes for adhering these environmental barrier seals to these substrates to protect the medium from environmental degradants, such as moisture and/or oxygen. It has further been found that the environmental barrier seal should comprise: (a) an inner layer comprising a thermally meltable adhesive that is adhered to the substrates; (b) an outer layer comprising a moisture impervious plastic; (c) an intermediate layer positioned between the inner and outer layers and comprising a moisture and oxygen impervious metallic foil; and (d) optionally a tie layer between the outer and intermediate layers.

An illustrative example of a suitable environmental barrier seal material is a heat sealable foil barrier laminate such as PAKVF4, MarvelSeal 360 or MarvelSeal FR2175, etc. Heat sealable foil barrier laminates have a heat sealable thermally meltable adhesive layer that, when subjected, for example, to embodiments of the heat sealing process of the present invention, welds, fuses, glues or otherwise bonds the laminate to the substrates because of the melting, welding, fusing, gluing or bonding together of the adhesive layer and the melted portion of the substrate. The metallic (e.g., aluminum) foil layer sandwiched between the adhesive and tie layers of the heat sealable foil barrier laminate provides effective environmental barrier protection against both oxygen and water vapor, and is flexible and easily conforms to the outer peripheral edge of each of the substrates. These heat sealable foil barrier laminates also provide additional moisture protection by having an outer moisture impervious layer adhered to the metallic foil layer, typically by the tie layer.

Articles of the present invention may be of any thickness needed. For example the article may be thin for display holography or thick for data storage. For data storage applications, the article is typically from about 0.2 to about 2 mm, more typically from about 1 to about 1.5 mm in thickness, and is typically in the form of a film or sheet of holographic recording medium between two substrates with at least one of the substrates having an antireflective coating and may be sealed against moisture and air. An article of the present invention may also be made optically flat via the appropriate processes, such as the process described in U.S. Pat. No. 5,932,045 (Campbell et al.), issued Aug. 3, 1999, the entire contents and disclosure of which is herein incorporated by reference.

Articles of the present invention may be used for decorative purposes. For example, the article may be used in gift wrap or in window treatments to provide special artistic tinting or 3D designs. The article may be used in molded parts of automobiles, toys, furniture, appliances, etc. to provide decorative effects. An article of the present invention may also be used to make data storage devices of various sizes and shapes, as a block of material or as part of a coating that is coated on a substrate.

Figure 2:
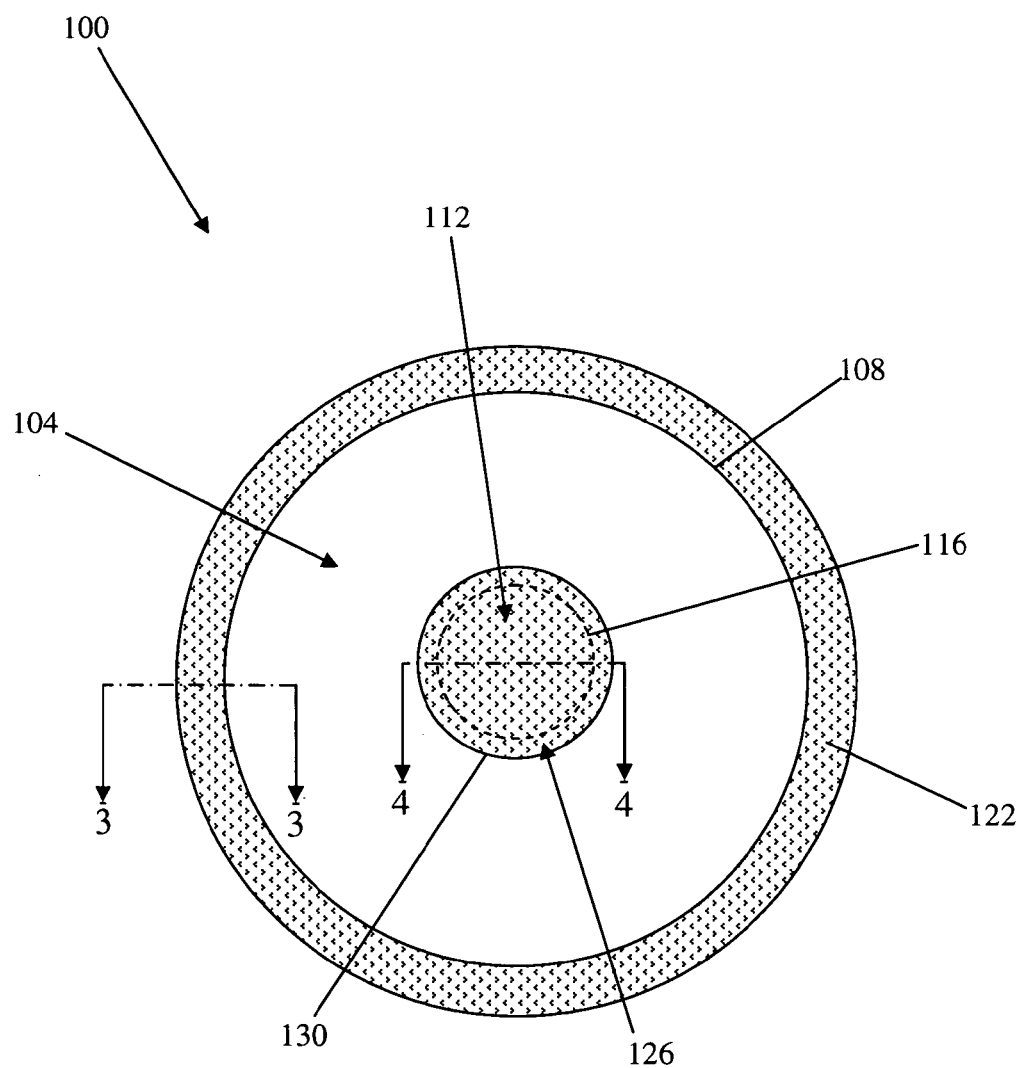
FIG. 2 is a top plan view of an embodiment of an article according to the present invention.

Various embodiments of the article of the present invention are further illustrated by reference to the drawings. Referring to FIG. 2, an embodiment of an article of the present invention is indicated generally as 100, which may be used to store data (e.g., as a CD), record holograms for other purposes, provide a waveguide, etc. While article 100 is shown in FIG. 2 as having a circular-shaped configuration (commonly referred to as a "disk," "DVD," "MO," or "CD" format), it may also have other shapes, configurations, etc., including oval, square, rectangular, etc., for example, a square-shaped configuration commonly referred to as a "coupon" format. The size of article 100 in terms of width/length, diameter, etc., may be of any suitable dimension. For example, for CD formats, article 100 typically has a diameter of from about 25 to about 140 mm, more typically from about 120 to about 130 mm.

Article 100 comprises a pair of substrates, one of which is shown in FIG. 1 as generally circular upper plate 104. Upper plate 104 has an outer peripheral edge indicated as 108 and a generally circular central aperture indicated as 112 having an outer perimeter indicated as 116. Also shown in FIG. 1 is an outer generally annular peripheral edge environmental barrier seal indicated as 122 that is secured, attached or otherwise adhered to peripheral edge 108 and a generally circular upper central environmental barrier seal 126 having an outer peripheral edge 130 that extends beyond perimeter 116.

Figure 3:
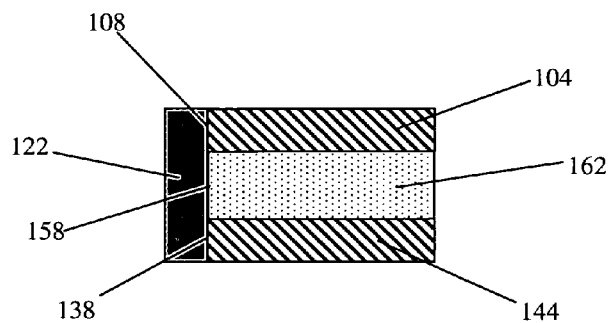
FIG. 3 is a side sectional view taken along line 3—3 of FIG. 2.
Figure 4:
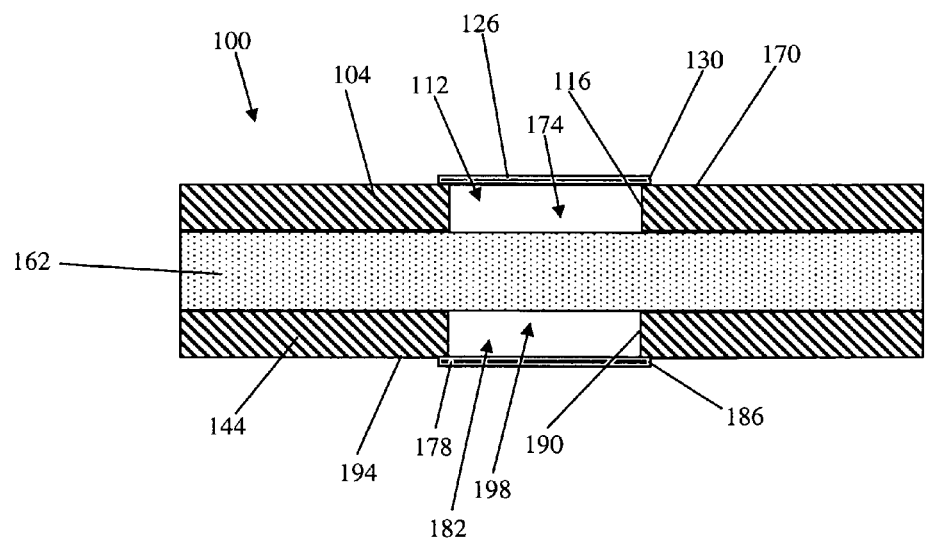
FIG. 4 is a side sectional view taken along line 4—4 of FIG. 2.

Referring to FIG. 3, peripheral edge seal 122 is adhered to peripheral edge 108 of upper plate 104, as well as outer peripheral edge 138 of generally circular lower plate 144. Peripheral edge seal 122 encloses or is adhered to exposed outer peripheral edge 158 of a generally circular piece of a film or sheet of a holographic recording medium 162 positioned between upper plate 112 and lower plate 142. Referring to FIG. 4, upper seal 126 is shown as being positioned over the upper portion of aperture 112 with peripheral edge 130 of upper seal 126 extending beyond perimeter 116 and being adhered to the outside surface 170 of upper plate 112 so as to seal off and enclose the generally circular-shaped upper central exposed area 174 of medium 162. A lower seal 178 of similar or different shape to upper seal 126 is also provided that is positioned over aperture 182 of lower plate 144 with the peripheral edge 186 of lower seal 178 extending beyond perimeter 190 of aperture 182 and being adhered to the outside surface 194 of lower plate 142 so as to seal off and enclose the generally circular-shaped lower central exposed area 198 of medium 162.

An alternative embodiment for sealing the upper exposed central area 174 and the lower central exposed area 198 of medium 162 is shown in FIG. 5. In FIG. 5, upper seal 226 is shown as being adhered to the inside surface 270 of upper plate 112 with a peripheral edge 230 extending beyond perimeter 116 of aperture 112 to enclose and seal off upper central exposed area 174 of medium 162. A lower seal 278 is also shown in FIG. 5 as being adhered to the inside surface 294 of lower plate 142 with a peripheral edge 286 extending beyond perimeter 190 of aperture to 182 to enclose and seal off lower central exposed area 198 of medium 162.

An embodiment of an environmental barrier material that can be used in seal 122, 126, 178, 226 or 278 is shown in FIG. 6 and indicated generally as heat sealable foil barrier laminate 310. Heat sealable foil barrier laminate seal 310 comprises an inner layer 314 comprising a thermally meltable adhesive and having an inner surface 318 that is adhered to plates 112 and 144 (e.g., at peripheral edges 108/138, to outside/inside surfaces 170/270, to outside/inside surfaces 186/286, etc.). Heat sealable foil barrier laminate 310 next comprises an intermediate layer 322 comprising a metallic foil and positioned adjacent to and between inner layer 314 and tie layer 326. Intermediate layer 322 is adhered to inner layer 314 at the interface thereof indicated as 330 and to tie layer 326 at the interface thereof indicated as 334. Tie layer 326 is positioned adjacent to and between intermediate layer 322 and outer layer 338 comprising a moisture impervious plastic. Tie layer 326 is adhered to outer layer 338 at the interface thereof indicated as 342.

Articles comprising the holographic recording medium and associated substrates can introduce anisotropic behavior into the holographic recording medium that prevents the recovery of holograms at temperatures that depart from, and especially substantially depart from the recording temperature. In at least some embodiments, recovery of recorded holograms may require that the holographic recording medium be substantially uniform and isotropic with regard to thermally induced-dimensional changes. When a holographic recording medium is cured between substrates, the holographic recording medium may form a bond with the associated substrates, either covalently or noncovalently. This bond may prevent delamination of the holographic recording medium from the substrates. Such delamination could lead to stray reflections and distortions in the light path through the holographic recording medium, both of which are detrimental to recording and recovering holograms.

This bond between the holographic recording medium and the associated substrates is also desirable in those applications whereby the article comprising the holographic recording medium is rendered optically flat. However, the bonding of the holographic recording medium to the associated substrates causes the holographic recording medium to have anisotropic or substantially anisotropic behavior when there are thermally induced-dimensional changes. Such anisotropic behavior is also detrimental to recovery of recorded holograms. For example, as the temperature of the holographic recording medium increases above (or decreases below) that of the temperature that the hologram(s) is recorded, the holographic recording medium expands/contracts at different rates depending on the direction, i.e., the expansion/contraction of the holographic recording medium becomes directionally dependent. The holographic recording medium may have a relatively low expansion/contraction in the X and Y directions (i.e., parallel with the associated substrates), and a relatively high expansion/contraction in the Z-direction, i.e., the direction perpendicular to the X-Y plane that encompasses the associated substrates.

This anisotropic behavior occurs because the associated substrates bonded to the holographic recording medium may have a lower CTE value over the operative temperature range that the hologram is recorded and recovered from the holographic recording medium. In addition, the article comprising the holographic recording medium and associated substrates is typically longer and wider in the X- and Y-directions, compared to the Z-direction (i.e., the article is longer and wider compared to its thickness). As the temperature departs (lower or higher) from the temperature where the holographic recording medium was set or cured (i.e., when the medium became associated with the substrates), the holographic recording medium becomes restrained or constrained in the X and Y directions by the associated substrates which is not expanding (or contracting) as fast or as quickly as the holographic recording medium. This restraint/constraint creates an internal stress in the holographic recording medium that can typically be relieved only by expanding/contracting primarily in the Z-direction. In other words, the expansion/contraction of the holographic recording medium is greater in the Z-direction, compared to the X- and Y-directions, thus causing anisotropic behavior in the holographic recording medium.

An embodiment of an article for solving these problems involves positioning a CTE compensating interface between the holographic recording medium and associated substrates. See copending U.S. patent application Ser. No. 11/237,883, to Coles et al., filed Sep. 29, 2005, entitled "Holographic Recording Medium and Substrate with CTE Compensating Interface Therebetween," the relevant disclosure of which is herein incorporated by reference. Typically, this CTE compensating interface "decouples" or substantially "decouples" the CTE properties of the holographic recording medium from the CTE properties of the associated substrates so that each respond, function, etc., independently or substantially independently to CTE effects, e.g., changes in temperature, etc. By "decoupling" the CTE properties of the holographic recording medium from those of the associated substrates, the holographic recording medium can respond isotropically, or at least more isotropically, to changes in temperature, especially in the Z-direction or dimension of the medium. This ability to respond isotropically, or at least more isotropically, to changes in temperature enables or at least renders more practical, for example, the recovery of holograms from the holographic recording medium, for example, by using a tunable laser.

In addition, by "decoupling" these CTE properties, the benefits of using holographic recording mediums and associated substrates having different, and potentially greatly different CTE values over the operative temperature range for recording and recovering holograms can be realized. For example, holographic recording mediums having increased diffusion rates of the unexposed/unpolymerized material in the medium (that also tend to have relatively high CTE values (e.g., at least about 200, and more typically from about 200 to about 400) can be used to obtain the benefit of increased and improved sensitivity in the medium in recording holograms. Conversely, in the case of associated substrates that have lower CTE values (e.g., about 100 or less, more typically about 80 or less), desirable properties of such substrates (e.g., mechanical rigidity, barrier properties, etc.) that result from such lower CTE values can also be retained.

The ability of the CTE compensating interface to "decouple" the CTE properties of the holographic recording medium and the associated substrates can be achieved in a number of different ways. For example, the CTE compensating interface can be a "slip layer" comprising a plastic, thixotropic, or more typically liquid material that has the ability to flow under mechanical stress, and thus relieve any mechanical stress in the holographic recording medium that would affect or interfere with the medium's ability to respond isotropically to changes in temperature. In some embodiments, the "slip layer" keeps the holographic recording medium from being bonded, directly or indirectly, to the associated substrates. As a result, the holographic medium can expand or contract in response to changes in temperature independently, or at least relatively independently, of the associated substrates, i.e., because the "slip layer" permits the holographic recording medium to slide or slip relative the associated substrates. In some embodiments, the "slip layer" should comprise less viscous materials (e.g., materials having viscosities of from about 500 to about 10,000 centipoise) that can respond more rapidly or quickly to the need for stress release in the holographic recording medium, e.g., faster slippage of the holographic recording medium relative to the associated substrates.

The material comprising the "slip layer" can be positioned between the holographic recording medium and the associated substrates in a variety of ways. For example, the "slip layer" material can be applied or otherwise deposited on the substrate, with the holographic recording medium then being applied or otherwise deposited on the "slip layer" material, i.e., a sandwich-type structure. In an alternative embodiment, the holographic recording medium can comprise compositions, compounds, materials, etc., such as surface active agents (surfactants) that have relatively low surface energy and preferentially migrate to the interface between the holographic recording medium and the associated substrates. In some embodiments, silicones may be useful as such surfactants, as well as other surfactant molecules (e.g., Surfynol surfactants from Air Products) having respective portions that match or substantially match, respectively, the surface energies of the holographic recording medium (especially the support matrix) and the associated substrates. In another alternative embodiment, the "slip layer" material can be applied or otherwise deposited on the holographic recording medium, with this combination then being placed on the associated substrates with "slip layer" material being positioned between the medium and the substrates.

In another alternative embodiment, the associated substrates can be treated with a "slip layer" material that bonds, directly or indirectly, to the substrates, but not to the holographic recording medium. For example, the substrate surface facing the holographic recording medium could be treated with a material that covalently or otherwise bonds directly to the substrate. This material bonded to the substrate would also provide a holographic recording medium-facing surface having a relatively low surface tension or coefficient of friction relative to holographic recording medium.

In another alternative embodiment, the "slip layer" material could be applied or otherwise deposited so that it bonds, directly or indirectly, to the holographic recording medium, but not to the associated substrates. For example, the holographic recording medium could comprise a support matrix of polyurethane formed by the reaction between a multifunctional polyol (e.g., a polyethylene oxide, polypropylene oxide, etc., such as glycerol propoxylate having a molecular weight of about 1500 (e.g., GPX 1500)) and a multifunctional polyisocyanate (e.g., Bayer's WE180 with a 5 mole % excess of isocyanates groups). In this embodiment, the "slip layer" could comprise the polyol component of the polyurethane used in the support matrix of the holographic recording medium. Although a portion of the polyol in the "slip layer" would react with the isocyanate groups in the support matrix, a substantial excess of polyol would remain unreacted and would be present on the associated substrates. This remaining portion of unreacted polyol would form the "slip layer" between the holographic recording medium and the associated substrates.

In an alternative embodiment, the CTE compensating layer could comprise a solid material (e.g., a solid film, etc.), which may or may not be recordable medium. For example, a solid film having the same or higher CTE value than that of the support matrix of the holographic recording medium could be positioned between the holographic recording medium and the associated substrates. For example, in some embodiments, the solid film may comprise silicone polymers that have relatively high CTE values (e.g., SORTA Clear and Rubber Glass™ Silicone Rubbers from Smooth-On), as well as lower molecular weight thermoplastics (e.g., 3M™ Jet-Melt™ Adhesive 3792 LM), highly plasticized thermoplastics (e.g., VistaFlex™ Thermoplastic Elastomer from Santoprene™ Specialty Products), minimally cross-linked polyurethanes (e.g., the polyurethane obtained by reacting the polyol GPX 3600 with the polyisocyanate WEI80), some synthetic rubbers (e.g., acrylonitrile-butadiene or chloroprene rubbers), etc. Use of such a solid film would enable the associated substrates, as well as the holographic recording medium, to be directly bonded or otherwise directly adhered to opposite sides of the solid film layer.

Depending on the thickness thereof, such a solid film layer could absorb or dissipate much of the internal stress caused by the respective thermal expansions and contractions of the holographic recording medium and associated substrates. In addition, because the CTE effects of the associated substrates are primarily surface effects, such a solid film could thus form a "buffer layer" between the support matrix of the holographic recording medium and the associated substrates, i.e., the medium and substrates, again, would function independently, or substantially independently with regard to CTE effects. In particular, as the thickness of the holographic medium increases, the CTE effects from the associated substrates would become a smaller and smaller percentage of the bulk CTE effect on the holographic recording medium.

Another embodiment of a CTE compensating interface can comprise a combination of the properties of a solid film with the properties of a liquid "slip layer." For example, a telechelic polymer could be used as the CTE compensating interface. One end of the telechelic polymer would be functionalized to bond (covalently or otherwise) with the associated substrates, while the other end of the telechelic polymer would be functionalized to bond (covalently or otherwise) with the support matrix of the holograph recording medium. In other words, the CTE compensating interface comprising such a polymer would function as a flexible "tether" between the associated substrates and the support matrix of the holographic recording medium. The more flexible a "tether" the polymer provides (e.g., because of the length between the respective functional groups), the broader the usable temperature range for recording and recovering holograms can be. Such a flexible polymeric "tether" could comprise a material having a relatively high CTE value such as an appropriately functionalized telechelic.

While the "slip layer" or other CTE compensating interface can be positioned between all facing areas, sections, portions, etc., of the holographic recording medium and the associated substrates, the benefits of the "slip layer" or other CTE compensating interface can also be obtained by positioning the "slip layer" or other CTE compensating interface only between certain adjacent or facing areas, sections, portions, etc., of the holographic recording medium and the associated substrates. For example, in certain embodiments, the "slip layer" or other CTE compensating interface can be positioned between the holographic recording medium and the associated substrates only in those adjacent or facing areas, sections, portions, etc., where data recording is to take place, or is likely to take place. For all other areas sections, portions, etc., such as at the edges of the article, at the center portion for some formats (e.g., CDs, etc.) where data recording does not take place, etc., the holographic recording medium could be directly bonded or otherwise adhered to the associated substrates. The substrates may be bonded or otherwise adhered together (e.g., through the use of an adhesive, etc.) in those portions where the holographic recording medium is not present, or where data recording does not, or is not likely to, take place (e.g., at the edges of the substrates, the center of the substrates in certain formats such as CDs, etc.). If necessary for enabling recording of data by the holographic recording medium, the "slip layer" or other CTE compensating interface can also be optically transparent to enable such recording of data by the medium.

While "slip layers" or other CTE compensating interfaces can permit the holographic recording medium to slip or slide relative to the associated substrates or otherwise compensate for the difference in CTE values, the materials comprising the "slip layer" may still impart sufficient friction between the medium and substrates such that the medium may not be able respond as rapidly or as quickly as needed to changes in temperature, especially large temperature swings. Such friction can be alleviated or lessened by increasing the thickness of the "slip layer." In some embodiments, the "slip layer" has a thickness of at least about 0.1 micron, more typically as least about 1 micron, and most typically at least about 10 microns. Conversely, while "slip layers" having thicknesses greater than about 100 microns are useful and within the scope of the present invention, "slip layer" thicknesses greater (and especially much greater) than about 100 microns increase the overall thickness of the article without typically any corresponding increase in benefit of the "slip layer." Accordingly, "slip layers" of the present invention, in at least some embodiments, may have a thickness in the range of from about 0.1 to about 100 microns, typically in the range of from about 1 to about 100 microns, more typically from about 10 to about 100 microns.

If desired, the "slip layer" or other CTE compensating interface can be matched regarding the refractive index with the holographic recording medium or the associated substrates. Alternatively, the "slip layer" can have a refractive index value between that of the substrate and that of the holographic recording medium. The holographic recording medium or the associated substrates are also, in at least some embodiments, non-water absorbing; the "slip layer" or other CTE compensating interface also typically comprises materials that are non-water absorbing. The material comprising the "slip layer" or other CTE compensating interface can also be chosen such that photoactive components in the holographic recording medium do not (or minimally) leach or otherwise diffuse into the "slip layer"/CTE compensating interface.

Figure 7:
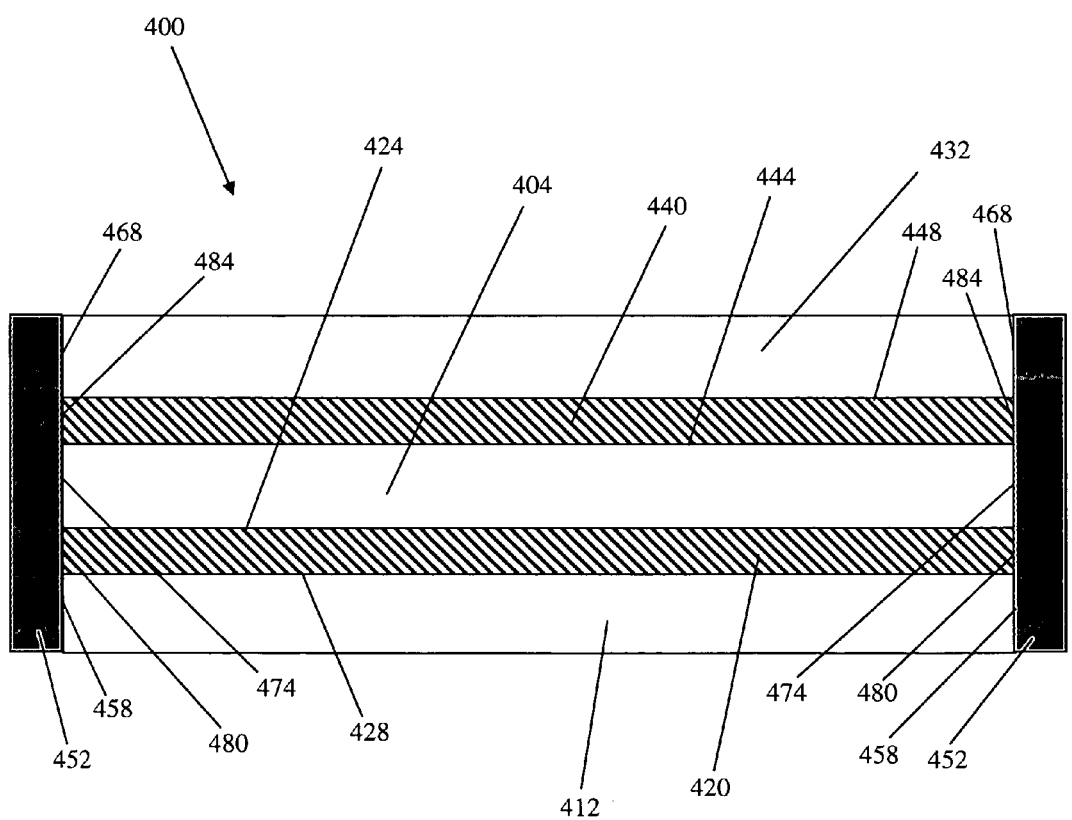
FIG. 7 is a side sectional view of an alternative embodiment of an article of the present invention having "slip layers;"

Embodiments of the article of the present invention having edge environmental barrier seals and comprising "slip layers" are further illustrated by FIG. 7. Referring to FIG. 7, article 400 (e.g., a "disk/CD" or "coupon" configuration or format) comprises a pair of substrates in the form of lower plate 412 and upper plate 432 with a film or sheet of holographic recording medium 404 being positioned between plates 412 and 432. Also positioned between plate 412 and medium 404 is a first lower slip layer 420 that can extend the entire length of adjacent lower surface or side 424 of medium 404 and adjacent inner surface 428 of lower plate 412. Also positioned between upper plate 432 and medium 404 is a second upper slip layer 440 that can extend the entire length of adjacent upper surface or side 444 of medium 404 and adjacent inner surface 448 of plate 432. At least one of plates 412 and 432 (typically upper plate 432) is optically transparent to enable the recording of data by medium 404. At least one of the slip layers 420 and 440 (typically slip layer 440) is also optically transparent to enable the recording of data by medium 404. In an alternative embodiment of article 400, either slip layer 420 or slip layer 440 could be absent. A peripheral environmental barrier seal 452 is adhered to respective peripheral edges 458 and 468 of plates 412 and 432 so as to enclose and seal exposed peripheral edges 474, 480 and 484 of medium 404, as well as slip layers 420 and 440.

Figure 8:
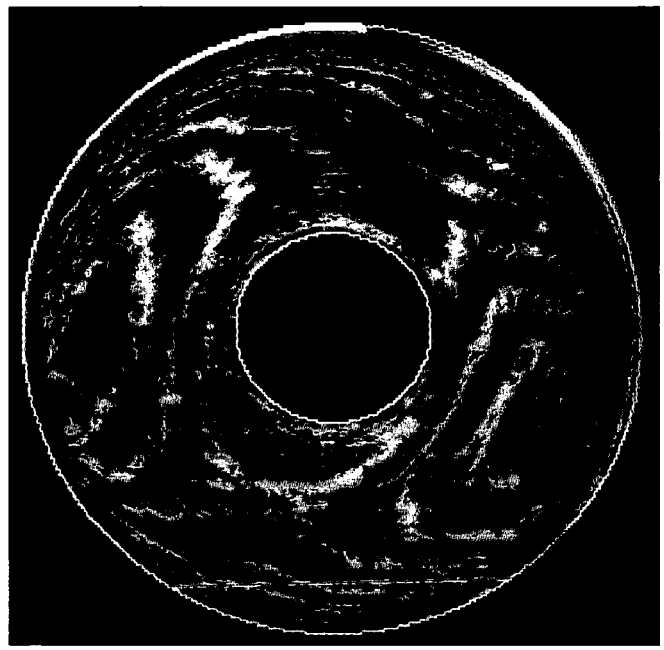
FIG. 8 is an image of an article in a 130-mm disk format without environmental barrier seals prior to exposure to a high humidity environment.
Figure 9:
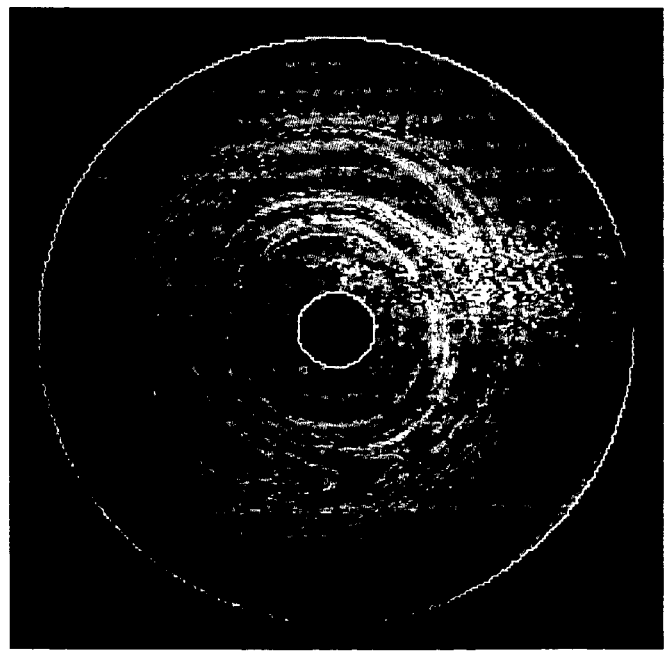
FIG. 9 is an image of the unsealed article of FIG. 8 after exposure to a high humidity environment.

The benefit of using environmental barrier seals such as 122, 126, 178, 226, 278 and/or 452 is illustrated by FIGS. 8–11. FIG. 8 shows an image of an article like 100 without such environmental barrier seals, and prior to exposure to a high humidity environment of 95% RH at 80° C. By comparison, FIG. 9 shows the same article as in FIG. 8, but after exposure to a high humidity environment of 95% RH at 80° C. for 4 days. The effect on the holographic recording medium to moisture exposure is evidenced in FIG. 9 by the concentric fringe rings that proceed from the outer edge of the article towards the center of thereof. The effect of this moisture exposure has also been found not to be fully reversible, even after removing the moisture from the exposed article of FIG. 9.

Figure 10:
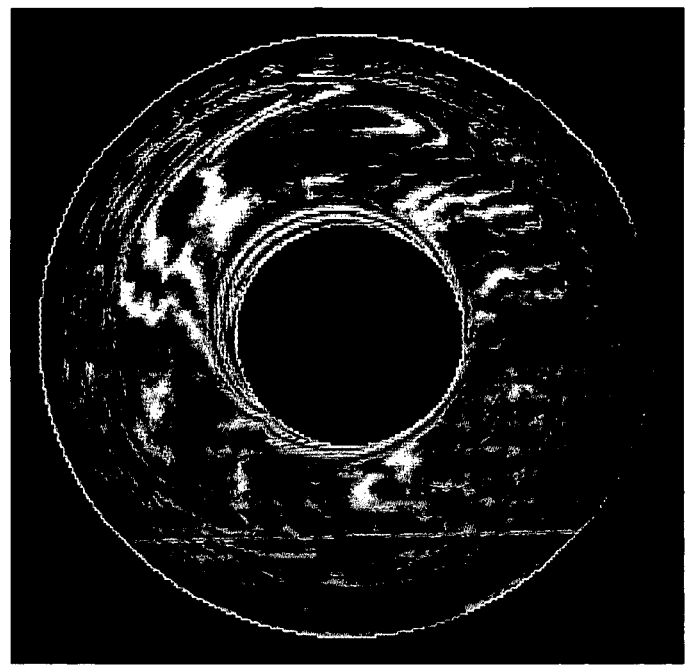
FIG. 10 is an image of an article in a 130-mm disk format like that shown in FIGS. 9–10, but with environmental barrier seals prior to exposure to a high humidity environment.
Figure 11:
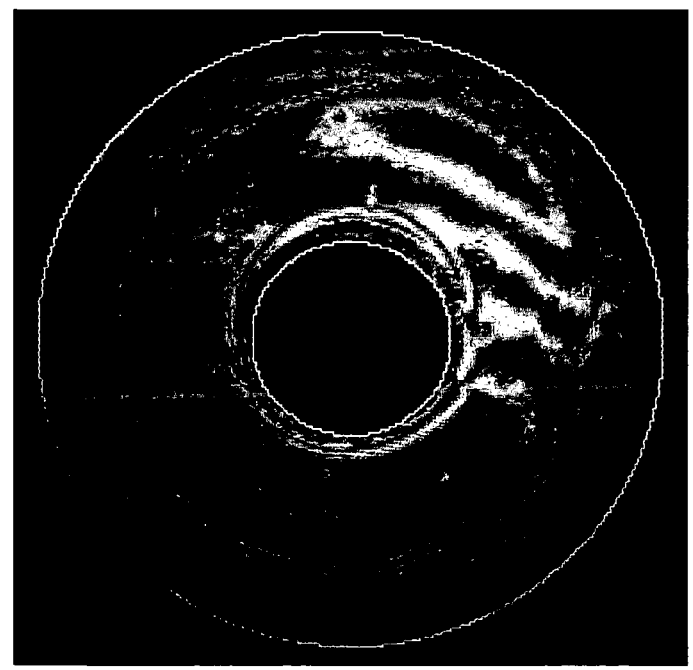
FIG. 11 is an image of the sealed article of FIG. 10 after exposure to a high humidity environment, i.e., 95% RH at 80° C.

FIG. 10, like FIG. 8, is an image of an article prior to exposure to a high humidity environment of 95% RH at 80° C. Unlike the article of FIG. 8, the article of FIG. 10 is provided with peripheral edge environmental barrier seals (e.g., like seal 122), as well as upper and lower environmental barrier seals (e.g., upper and lower seals 126 and 178) over the upper and lower portion of the central aperture of the article. As a result, and as shown in FIG. 11, providing the article with such environmental barrier seals prevents or at least minimizes such moisture exposure effects, even after exposure of the article to the high humidity environment (i.e., 95% RH at 80° C.) for 82 days.

Description of Heat Sealing Process and Apparatus

The environmental barrier seals such as 122, 126, 178, 226, 278 or 452 may be formed from bulk or stock material (e.g., a foil barrier laminate film) in the final shape of seal (e.g., the upper and lower seals 126, 178, 226 or 278) prior to being adhered to the substrates, can be provided from a continuous roll, sheet, etc., having a width that corresponds to or matches the thickness of the article that is then slit, cut, etc., to desired length, to provide, for example, a peripheral edge seal, or by any other suitable method. The seal that is formed from the bulk or stock material may then be adhered to the substrates of the article by any suitable method for adhering thermal meltable adhesive materials to other thermoplastic materials. Alternatively, the bulk or stock material may be adhered to the substrates of the article, and the seal then formed to the desired shape or configuration by cutting, trimming, etc.

The peripheral edge environmental barrier seal, in at least some embodiments, may be formed from a continuous roll of, for example, foil barrier laminate film, such as that illustrated in FIG. 6, and having a width corresponding to or matching the thickness of the article, i.e., the combined thickness of the substrates and holographic recording medium, that is then cut, slit, etc., to an appropriate length to correspond to or match the length of the peripheral edge of the substrates, e.g., the length of the circumference thereof for a CD disk type format. In some embodiments, after being cut to the appropriate length, the cut length of foil barrier laminate film may then be adhered to the peripheral edges of the substrates by using a heat sealing step that causes the thermally meltable adhesive (e.g., thermoplastic) layer, as well as the peripheral edges of the substrates, to melt or become molten. In at least some embodiments, during this heat sealing step, and while the thermally meltable adhesive layer and the peripheral edges of the substrates are in contact, pressure may be applied at the point of contact to ensure that an appropriate bond or seal is formed between the thermally meltable adhesive layer and the peripheral edges of the substrates. This heat and pressure is applied to the point of contact for a sufficient amount of time such that the foil barrier laminate film adheres to the peripheral edges of the substrates, and thus forms a seal of sufficient strength and quality.

Figure 12:
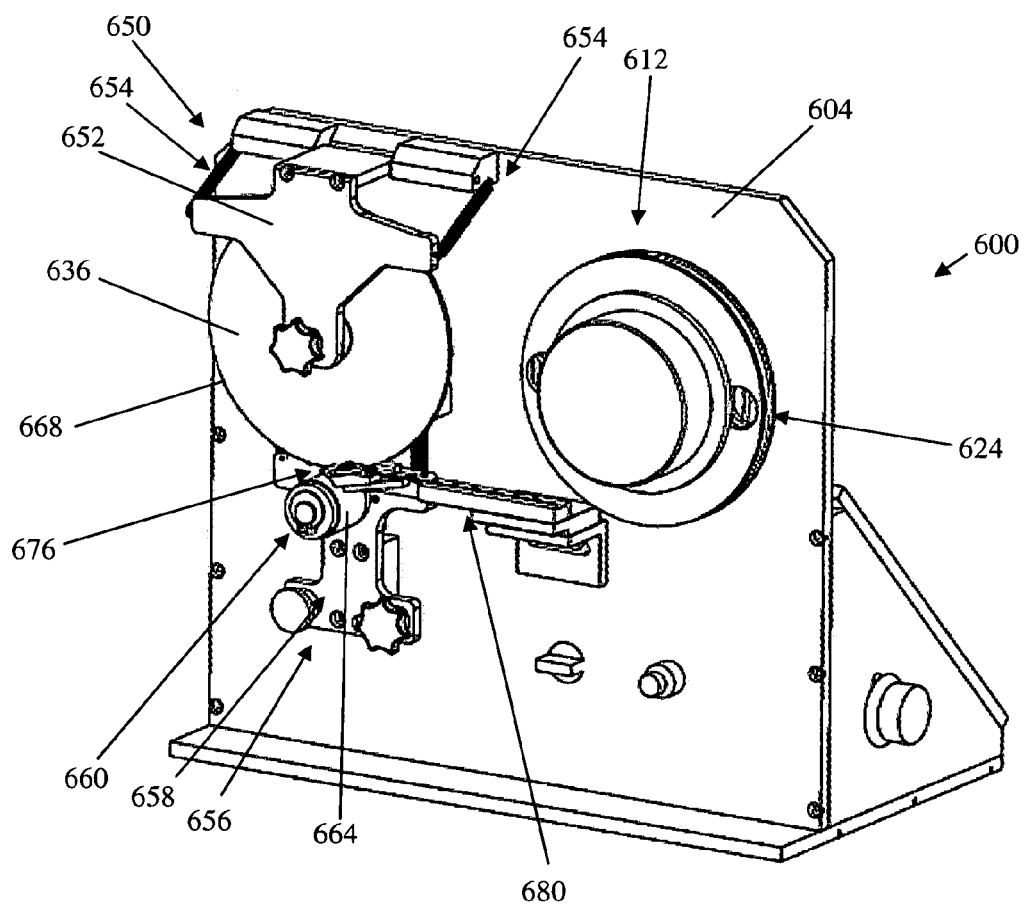
FIG. 12 is a perspective view of an apparatus for carrying out an embodiment of the peripheral edge heat sealing process of the present invention with a disk to be sealed.
Figure 13:
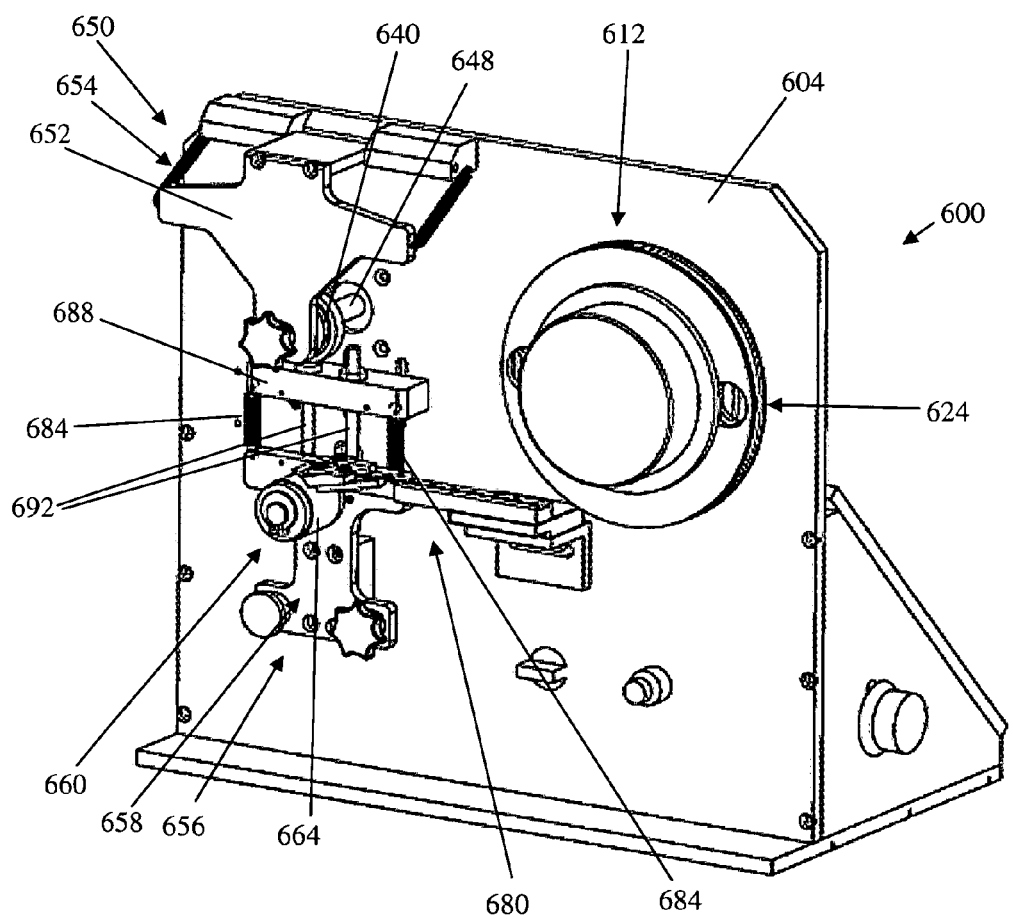
FIG. 13 is a perspective view of the apparatus of FIG. 12, but with the disk absent.

An embodiment of an apparatus for heat sealing, for example, a foil barrier laminate film to the peripheral edges (e.g., edges 108 and 138) of the substrates to form a peripheral edge seal (e.g. seal 122) to enclose the peripheral edge of the holographic recording medium is illustrated in FIGS. 12–13. Referring to FIGS. 12–13, an apparatus for carrying out this heat sealing operation is referred to generally as 600 that includes a support frame indicated generally as 604. Rotatably mounted on the upper right corner or section of frame 604 is a film dispenser indicated generally as 612 that includes a rotatably mounted spindle reel indicated generally as 624 for supplying a roll of, for example, foil barrier laminate film that has previously been slit or cut to a width to match the overall thickness of the article (i.e., the combined thicknesses of the substrates and holographic recording medium).

A generally circular-shaped article CD disk article comprising the substrates with the holographic recording medium positioned therebetween to be sealed is indicated generally as 636. Disk 636 has circular disk hub (not shown) attached to the lower substrate is coupled to corresponding generally circular drive spindle hub 640 for mounting disk 636 thereon. Although not shown, a locking pin that protrudes outwardly from drive hub 640 is provided to engage a corresponding mating hole in the disk hub of disk 636 to prevent rotation of disk 636 relative to drive hub 640. Drive hub 640 is connected to a drive motor shaft 648 rotatably mounted on the upper left corner or section of frame 604 that is rotated by a motor (not shown). Disk 636 is secured in place against drive hub 640 by a disk clamp assembly indicated generally as 650 having a clamp component 652 pivotally mounted on frame 604 and a pair springs 654 for biasing or urging clamp component 652 against the central portion of disk 636 to secure it against drive hub 640.

Apparatus 600 further includes a high temperature pressure roller assembly indicated generally as 656 that comprises a roller support indicated as 658 that is slidably mounted on frame 604 for lateral vertical movement towards or away from disk 636. Assembly 656 further includes a high temperature roller indicated as 660 rotatably mounted on support 658. Roller 660 has a surface 664 that is covered with a flexible material such as rubber that engages the peripheral edge indicated as 668 of disk 636 to make a pressure contact nip indicated as 676 between edge 668 and roller surface 664. A film guide and roller assembly indicated generally as 680 is fixedly mounted on frame 604 for guiding and feeding the dispensed foil barrier laminate film from reel 624 to nip 676 as disk 636 is rotated by the drive motor shaft 648.

The pressure exerted at nip 676 is controlled by pressure control springs 684 (of which two are shown in FIG. 13 but upwards of four may be used) secured at the lower end to roller support 658 and at the upper end to a spring support block 688 that is slidably mounted on frame 604 for lateral vertical movement. A pair of spaced apart elongated pins 692 are also mounted by support block 688 to provide a fixed stop to resist further upward lateral movement of roller support 658. Roller surface 664 is heated to an appropriate temperature to cause melting of the thermally meltable adhesive layer of dispensed film (e.g., typically at a temperature of about 150° C. or higher, more typically at a temperature of about 175° C. or higher, and typically within the range from about 175° C. to about 185° C.). The combination of heat, pressure and contact time provided by the combination of roller surface 664 and edge 668 at pressure contact nip 676 and the rotational speed of drive motor shaft 648 ensures that the seal formed is of optimal seal strength and seal quality. For foil barrier laminate films such as PAKVF4 material, temperatures of 180° C. (±5° C.) at roller surface 664, pressures of about 175 psi at pressure contact nip 676, and a rotational speed for drive motor shaft 648 of about 2 min/rev can provide optimal seal strength and seal quality.

The upper and lower seals (e.g., upper and lower seals 126 and 178) are typically cut or otherwise formed to an appropriate shape (e.g., circular) to adequately cover the disk center hole (e.g., aperture 112) and to provide an adequate heat sealing area for the foil laminate film to the substrate (e.g., 104 or 144). The cut foil barrier laminate film may then be heat sealed (e.g., using temperatures similar to those for heat sealing the foil barrier laminate film to the peripheral edge 668) to the substrate using a heated press that in at least some embodiments corresponds to or matches the cut size of the seal.

Figure 14:
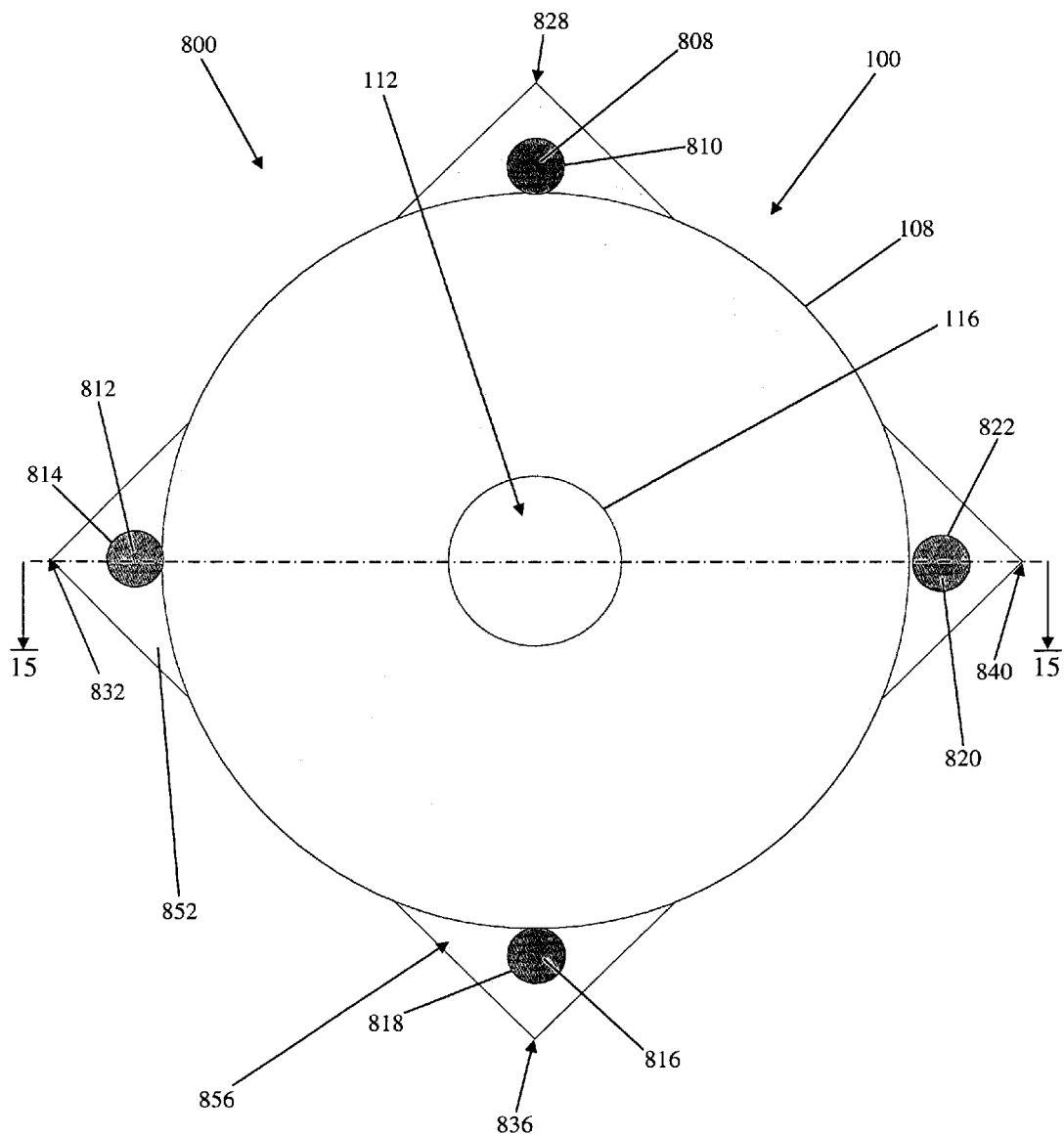
FIG. 14 is a top plan view of an apparatus for carrying out an embodiment of the center hole heat sealing process of the present invention.
Figure 15:
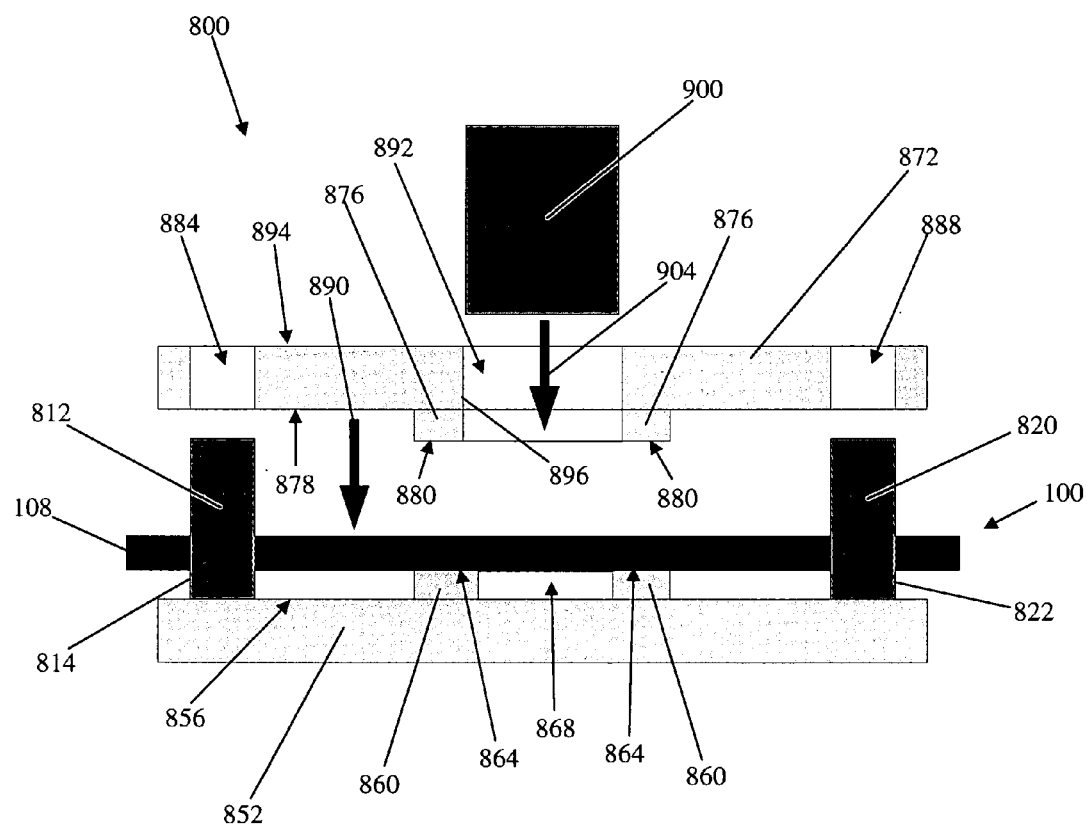
FIG. 15 is a side sectional view taken along line 15—15 of FIG. 14.

An embodiment of an apparatus for heat sealing, for example, the center hole or aperture (e.g., 112) of each substrate of the disk with a foil barrier laminate film (e.g., upper seal 126 or lower seal 178) is illustrated in FIGS. 14–15. Referring to FIGS. 14–15, an apparatus for carrying out this heat sealing operation is in the form of, for example, a heat sealing jig indicated generally as 800. As shown in FIG. 14, jig 800 comprises four generally cylindrical guide posts 808, 812, 816 and 820, each having respective perimeters 810, 814, 818 and 822. As shown in FIG. 14, the spacing of posts 808, 812, 816 and 820 is such that peripheral edge 108 of disk 100 is clear of or at least tangential to the respective perimeters 810, 814, 818 and 822 so that disk 100 can be positioned in the area between posts 808, 812, 816 and 820. As shown in FIG. 14, posts 808, 812, 816 and 820 are positioned at or proximate the four respective corners 828, 832, 836 and 840 of lower base plate 852 and are secured to the upper side 856 thereof.

Referring to FIG. 15, lower plate 852 has formed therein a generally annular and raised portion 860 extending upwardly from upper surface 856 that in at least some embodiments is machined or otherwise formed into lower plate 852 and has a lower disk area contacting surface indicated as 864. Lower disk area contacting surface 864 in at least some embodiments contacts the lower substrate (i.e., 144) of disk 100 in those areas that do not have recorded data. The generally cylindrical hole or bore 868 formed in raised portion 860 is sized to permit the disk hub attached to the lower substrate of disk 100 to fit therein so that the lower substrate of disk 100 may rest or seat against lower disk area contacting surface 864.

Jig 800 further comprises an upper plate 872 having formed therein a protruding generally annular portion 876 that extends downwardly from the lower surface 878 of upper plate 872 and has an upper disk contacting surface 880 that opposes and corresponds generally in shape and positioning to lower disk area contacting surface 864. Upper plate 872 is provided with vertically extending holes or bores for receiving guide posts 808 through 820, two of which indicated as 884 and 888 are shown in FIG. 15 that receive respective guide posts 812 and 820. As indicated by downwardly pointing arrow 890, when disk 100 is positioned in the area between guide posts 810 through 820, and against lower disk area contacting surface 864, upper plate 872 may be lowered such that upper disk area contacting surface 880 may rest or seat against the upper substrate (e.g., 104) of disk 100.

Upper plate 872 is also provided with a centrally positioned generally cylindrical press block hole or bore 892 that extends vertically from the upper surface 894 of upper plate 892 through protruding portion 876 and to the upper disk area contacting surface 880. The perimeter 896 of press block bore 892 extends beyond the perimeter (e.g., 116) of the central aperture (e.g., 112) of disk 100. A generally circular piece (not shown) of an environmental barrier seal material (e.g., a foil barrier laminate film) cut, formed or otherwise sized to the same diameter, or typically to a slightly smaller diameter, than the diameter of press block bore 892 (i.e., as defined by perimeter 896) is positioned within press block bore 892 and against the surface of the upper substrate (e.g., 104). Press block bore 892 then receives generally cylindrical press block 900 that is heated (e.g., to temperatures the same or similar to those used for securing the peripheral edge seal 122), is inserted into bore 892 in the direction indicated by arrow 904, and then pressed against the circular piece of an environmental barrier seal material for a sufficient period of time (typically a few seconds) to cause the inner thermally meltable layer to adhere against the upper substrate. Disk 100 can be flipped or turned over and the operation repeated to secure an environmental barrier seal over the aperture in the lower substrate of disk 100.

EXAMPLES

Example 1

A disc-type article 100 according to the embodiment of FIGS. 2–4 comprising: (1) a pair of upper and lower plates 104 and 144 each in the form of a circular-shaped piece of plastic; (2) a generally circular-shaped thermoplastic holographic recording medium 162 positioned between upper and lower plates 104 and 144; (3) a peripheral seal 122 adhered to peripheral edge 108 of upper plate 104, as well as peripheral edge 138 of lower plate 144; (4) a generally circular-shaped upper seal 130 positioned over the upper portion of aperture 112 with peripheral edge 130 of upper seal 126 extending beyond perimeter 116 and adhered to outside surface 170 of upper plate 104 so as to seal off and enclose the upper central exposed area 174 of medium 162; and (5) a generally circular-shaped lower seal positioned over aperture 182 of lower plate 144 with the peripheral edge 186 of lower seal 178 extending beyond perimeter 190 of aperture 182 and adhered to the outside surface 194 of lower plate 144 so as to seal off and enclose the lower central exposed area 198 of medium 162.

Peripheral seal 122 comprises a PAKVF4 foil laminate film 310 comprising, in order: (a) an inner LLDPE thermally meltable adhesive layer 314 having a nominal thickness equivalent of about 40 lbs. per 3000 ft² sheet; (b) a moisture and oxygen impervious aluminum foil layer 322 having a minimum thickness of 0.35 mils (8.9 microns); (c) a polyethylene tie layer 330 having a nominal thickness equivalent of about 14 lbs. per 3000 ft² sheet; and (d) a moisture impervious polyester (i.e., PET) outer layer 338 having a nominal thickness equivalent of 48 gauge. Film 310 is adhered to peripheral edges 108 and 138 by heat sealing at a temperature of 180° C. (±5° C.) using apparatus 600 of FIGS. 12–13.

Upper and lower seals 126 and 178 also comprise a PAKVF4 foil laminate film 310. Upper and lower seals 126 and 178 are adhered to respective outer surfaces 170 of upper plate 104 and 194 of lower plate 144 using jig 800 wherein the press block 900 is heated to a temperature of 180° C. (±5° C.) before insertion into bore 892 and pressing against a circular piece of PAKVF4 foil laminate film positioned over each of apertures 112 and 182 to adhere the film to respective outer surface 170 of upper plate 104 and outer surface 194 of lower plate 144.

Example 2

A disc-type article 400 comprising "slip layers" according to the embodiment of FIG. 7 is formed comprising: (1) a pair of upper and lower plates 432 and 412 each in the form of a circular-shaped piece of plastic; (2) a generally circular-shaped holographic medium 404 made from a mixture of GPX 1500 polyol and WE180 polyisocyanate as the support matrix with 4 wt. % acrylate as the photoactive monomer and 0.3 wt. % OxEO1 (from Ciba) as the photoinitiator; (3) a pair of generally annularly-shaped "slip layers" 440 and 420 each made by coating GPX 1500 polyol on the respective inner surfaces 448 and 428 of upper plastic plate 432 and lower plastic plate 412. "Slip layers" 420 and 440 comprising the GPX 1500 polyol are reacted with the WE180 polyisocyanate in medium 404 during curing thereof so as to be covalently bonded to the medium 404, but without forming a mechanical or covalent bond with the respective inner surfaces 428 and 448 of upper plastic plate 432 and lower plastic plate 412.

Adhered to the peripheral edges 458 and 484 of upper and lower substrates 432 and 412 is a foil barrier laminate seal 452. Peripheral seal 452 comprises a PAKVF4 foil laminate film 310 like that of Example 1. Film 310 is adhered to peripheral edges 458 and 484 as in Example 1 using apparatus 600.

All documents, patents, journal articles and other materials cited in the present application are hereby incorporated by reference.

Although the present invention has been fully described in conjunction with several embodiments thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. An article comprising:
   a pair of substrates each comprising a thermoplastic;
   a holographic recording medium positioned between the substrates such that the holographic recording medium has at least one exposed area; and
   an environmental barrier seal protecting the at least one exposed area from environmental degradants;
   wherein the environmental barrier seal comprises:
   an inner layer adhered to at least one of the substrates and comprising a thermally meltable adhesive;
   an outer layer comprising a moisture impervious plastic; and
   an intermediate layer positioned between the inner and outer layers and comprising a moisture and oxygen impervious metallic foil.

2. The article of claim 1, wherein the environmental barrier seal further comprises a tie layer positioned between the outer layer and the intermediate layer that adheres the outer layer to the intermediate layer.

3. The article of claim 2, wherein the tie layer comprises one or more film-forming thermoplastic polymeric materials.

4. The article of claim 3, wherein the tie layer comprises a film comprising one or more of: low density polyethylene, low density polyethylene, medium density polyethylene, polypropylene, copolymers of ethylene and propylene, terpolymers of ethylene, vinyl acetate and maleic anhydride, and terpolymers of ethylene, vinyl acetate and acrylic acid.

5. The article of claim 2, wherein the tie layer comprises one or more adhesive materials.

6. The article of claim 5, wherein the tie layer comprises one or more of ethylene vinyl acetate copolymers, ethylene methyl acrylate copolymers, and ethylene butyl acrylate copolymers.

7. The article of claim 1, wherein the metallic foil comprises aluminum foil.

8. The article of claim 1, wherein the moisture impervious plastic comprises one or more of: polyesters, copolyesters, polypropylene, polytetrafluoroethylene, nylon, polystyrene, a polycarbonate, an acrylonitrile, polyvinyl chloride, polyvinyl dichloride, ethylene vinyl alcohol, polyvinylidene chloride, ionomer-based polymers, and polyethylene.

9. The article of claim 8, wherein the moisture impervious plastic comprises one or more of: polyethylene terephthalate, polytetrafluoroethylene, nylon, low density polyethylene, and linear low density polyethylene.

10. The article of claim 1, wherein the thermally meltable adhesive comprises a thermoplastic film.

11. The article of claim 10, wherein the thermoplastic film comprises one or more of: polyethylene, polypropylene, copolymers of ethylene and propylene, terpolymers of ethylene, vinyl acetate and maleic anhydride, terpolymers of ethylene, vinyl acetate and acrylic acid polyester, ethylene vinyl acetate copolymers, ethylene methyl acrylate copolymers, and ethylene butyl acrylate copolymers.

12. The article of claim 1, wherein each substrate has a peripheral edge, and wherein the environmental barrier seal is adhered to the peripheral edges to enclose the exposed area.

13. The article of claim 12, wherein each substrate and the holographic recording medium are generally circular-shaped.

14. The article of claim 12, wherein each substrate and the holographic recording medium are generally square-shaped.

15. The article of claim 1, wherein the at least one exposed area is adjacent to an aperture in at least one of the substrates, and wherein the environmental barrier seal is adhered to the at least one substrate over the aperture to enclose the exposed area.

16. The article of claim 15, wherein the at least one substrate has an outside surface and wherein the environmental barrier seal is adhered to the outside surface.

17. The article of claim 15, wherein the at least one substrate has an inside surface adjacent the holographic recording medium, and wherein the environmental barrier seal is adhered to the inside surface.

18. The article of claim 15, wherein each substrate has an aperture and wherein an environmental barrier seal is adhered to each substrate over the aperture to enclose the exposed area.

19. The article of claim 15, wherein each substrate further includes a peripheral edge, and wherein an additional environmental barrier seal is adhered to the peripheral edges to enclose the exposed area.

20. The article of claim 1, wherein the article has a thickness of from about 0.2 to about 2 mm.

21. The article of claim 20, wherein the article has a generally circular shape and has a diameter of from about 25 to about 140 mm.

22. The article of claim 21, wherein the article has a thickness of from about 1 to about 1.5 mm and a diameter of from 120 to about 130 mm.

23. The article of claim 1, wherein a CTE compensating interface is positioned between the holographic recording medium and at least one of the substrates.

24. The article of claim 2, wherein a CTE compensating interface is positioned between the holographic recording medium and each of the substrates.

25. The article of claim 1, wherein the environmental barrier seal has a thickness of from about 3 to about 10 mils.

26. The article of claim 25, wherein the environmental barrier seal has a thickness of from about 4 to about 5 mils.

27. The article of claim 1, wherein the metallic foil comprises aluminum foil having a thickness of at least about 0.25 mm.

28. The article of claim 27, wherein the aluminum foil has a thickness of from about 0.28 to about 0.35 mm.

29. A process comprising the following steps of:
(1) providing an article comprising:
a pair of substrates each comprising a thermoplastic;
a holographic recording medium positioned between the substrates such that the holographic recording medium has at least one exposed area; and
(2) forming an environmental barrier seal to protect the at least one exposed areas from environmental degradants, wherein the environmental barrier seal comprises:
an inner layer adhered to at least one of the substrates and comprising a thermally meltable adhesive;
an outer layer comprising a moisture impervious plastic; and
an intermediate layer positioned between the inner and outer layers and comprising a moisture and oxygen impervious metallic foil.

30. The process of claim 29, wherein the environmental barrier seal further comprises a tie layer positioned between the outer layer and the intermediate layer that adheres the outer layer to the intermediate layer.

31. The process of claim 29, wherein each substrate has a peripheral edge, and wherein step (2) is carried out by heat sealing the environmental barrier seal to the peripheral edges to enclose the exposed area.

32. The process of claim 31, wherein the article provided by step (1) is generally circular-shaped and has a thickness, and wherein the environmental barrier seal is formed to have a width corresponding to the thickness of the article prior to carrying out the heat sealing of step (2).

33. The process of claim 31, wherein the heat sealing of step (2) is carried out while applying pressure to the thermally meltable adhesive layer and the peripheral edges of the substrates that are in contact.

34. The process of claim 31, wherein the heat sealing of step (2) is carried out at a temperature of about 150° C. or higher.

35. The process of claim 34, wherein the heat sealing of step (2) is carried out at a temperature of about 175° C. or higher.

36. The process of claim 29, wherein step (1) comprises providing an article having at least one exposed area adjacent to an aperture in at least one of the substrates, and wherein step (2) is carried out by positioning an environmental barrier seal formed into a shape to cover the aperture and heat sealing the positioned environmental barrier seal to the at least one substrate to enclose the exposed area.

37. The process of claim 36, wherein step (2) is carried out by pressing the positioned environmental barrier seal against the at least one substrate while the environmental barrier seal is being heat sealed to the at least one substrate.

* * * * *